United States Patent
Lee et al.

(10) Patent No.: US 9,171,753 B2
(45) Date of Patent: Oct. 27, 2015

(54) SEMICONDUCTOR DEVICES HAVING CONDUCTIVE VIA STRUCTURES AND METHODS FOR FABRICATING THE SAME

(71) Applicants: Ho-Jin Lee, Seoul (KR); Kyu-ha Lee, Yongin-si (KR); Gilheyun Choi, Seoul (KR); YongSoon Choi, Yongin-si (KR); Pil-Kyu Kang, Anyang-si (KR); Byung-Lyul Park, Seoul (KR); Hyunsoo Chung, Hwaseong-si (KR)

(72) Inventors: Ho-Jin Lee, Seoul (KR); Kyu-ha Lee, Yongin-si (KR); Gilheyun Choi, Seoul (KR); YongSoon Choi, Yongin-si (KR); Pil-Kyu Kang, Anyang-si (KR); Byung-Lyul Park, Seoul (KR); Hyunsoo Chung, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 234 days.

(21) Appl. No.: 13/758,239

(22) Filed: Feb. 4, 2013

(65) Prior Publication Data

US 2013/0210222 A1 Aug. 15, 2013

(30) Foreign Application Priority Data

Feb. 15, 2012 (KR) .................. 10-2012-0015238

(51) Int. Cl.
*H01L 21/768* (2006.01)
*H01L 23/00* (2006.01)
(Continued)

(52) U.S. Cl.
CPC ........ *H01L 21/768* (2013.01); *H01L 21/02271* (2013.01); *H01L 21/76898* (2013.01); *H01L 23/481* (2013.01); *H01L 24/03* (2013.01); *H01L 24/05* (2013.01); *H01L 24/13* (2013.01); H01L 21/6836 (2013.01); H01L 23/3192 (2013.01); H01L 24/06 (2013.01); H01L 25/0657 (2013.01); H01L 2221/68372 (2013.01); H01L 2224/02372 (2013.01); H01L 2224/0401 (2013.01); H01L 2224/05009 (2013.01); H01L 2224/05027 (2013.01); H01L 2224/0557 (2013.01); H01L 2224/05548 (2013.01); H01L 2224/05567 (2013.01); H01L 2224/05568 (2013.01); H01L 2224/05571 (2013.01); H01L 2224/06181 (2013.01); H01L 2224/131 (2013.01); H01L 2224/13006 (2013.01); H01L 2224/13009 (2013.01); H01L 2224/13022 (2013.01); H01L 2224/13023 (2013.01);
(Continued)

(58) Field of Classification Search
CPC .................. H01L 23/481; H01L 24/03; H01L 2225/06541; H01L 2225/06548; H01L 21/02164; H01L 21/0226; H01L 21/02271; H01L 21/76898
USPC .................. 438/666, 667, 778, 787; 257/698, 257/E23.174
See application file for complete search history.

(56) References Cited

U.S. PATENT DOCUMENTS 7,282,444 B2 10/2007 Tanida et al.
7,646,079 B2 1/2010 Umemoto
(Continued)

FOREIGN PATENT DOCUMENTS

KR 10-1052366 B1 5/2006

*Primary Examiner* — Mary Wilczewski
(74) *Attorney, Agent, or Firm* — Harness, Dickey & Pierce, P.L.C.

(57) ABSTRACT

In one embodiment, the method includes forming a conductive via structure in a base layer. The base layer has a first surface and a second surface, and the second surface is opposite the first surface. The method further includes removing the second surface of the base layer to expose the conductive via structure such that the conductive via structure protrudes from the second surface, and forming a first lower insulating layer over the second surface such that an end surface of the conductive via structure remains exposed by the first lower insulating layer.

19 Claims, 49 Drawing Sheets

(51) Int. Cl.
  *H01L 23/48* (2006.01)
  *H01L 21/02* (2006.01)
  *H01L 25/065* (2006.01)
  *H01L 23/31* (2006.01)
  *H01L 21/683* (2006.01)

(52) U.S. Cl.
  CPC ............... *H01L 2224/13025* (2013.01); *H01L 2224/13076* (2013.01); *H01L 2224/13082* (2013.01); *H01L 2224/14181* (2013.01); *H01L 2224/16146* (2013.01); *H01L 2224/16227* (2013.01); *H01L 2225/06513* (2013.01); *H01L 2225/06517* (2013.01); *H01L 2225/06541* (2013.01); *H01L 2225/06548* (2013.01); *H01L 2225/06565* (2013.01); *H01L 2924/00014* (2013.01); *H01L 2924/351* (2013.01)

(56) References Cited

U.S. PATENT DOCUMENTS

| | | | |
|---|---|---|---|
| 7,825,038 B2 * | 11/2010 | Ingle et al. | 438/778 |
| 7,825,468 B2 | 11/2010 | Kwon et al. | |
| 7,928,534 B2 | 4/2011 | Hsu et al. | |
| 7,935,643 B2 * | 5/2011 | Liang et al. | 438/761 |
| 8,426,308 B2 * | 4/2013 | Han et al. | 438/639 |
| 8,741,788 B2 * | 6/2014 | Liang et al. | 438/787 |
| 8,742,591 B2 * | 6/2014 | Choi et al. | 257/774 |
| 8,748,263 B2 * | 6/2014 | Kim et al. | 438/259 |
| 8,772,904 B2 * | 7/2014 | Liu et al. | 257/510 |
| 8,802,561 B1 * | 8/2014 | Yeh et al. | 438/634 |
| 8,816,491 B2 * | 8/2014 | Chen et al. | 257/698 |
| 8,841,769 B2 * | 9/2014 | Park et al. | 257/751 |
| 8,841,773 B2 * | 9/2014 | Chang et al. | 257/774 |
| 8,872,354 B2 * | 10/2014 | Kyu-hee et al. | 257/774 |
| 8,896,136 B2 * | 11/2014 | Tsai et al. | 257/797 |
| 8,900,994 B2 * | 12/2014 | Yu et al. | 438/667 |
| 8,927,426 B2 * | 1/2015 | Lee et al. | 438/667 |
| 8,937,011 B2 * | 1/2015 | Iuchi et al. | 438/622 |
| 8,940,637 B2 * | 1/2015 | Leong et al. | 438/667 |
| 8,941,216 B2 * | 1/2015 | Lee et al. | 257/621 |
| 2004/0245623 A1 | 12/2004 | Hara et al. | |
| 2005/0151228 A1 | 7/2005 | Tanida et al. | |
| 2007/0052067 A1 | 3/2007 | Umemoto | |
| 2007/0281106 A1 * | 12/2007 | Lubomirsky et al. | 427/569 |
| 2007/0289534 A1 * | 12/2007 | Lubomirsky et al. | 118/723 R |
| 2008/0157394 A1 | 7/2008 | Kwon et al. | |
| 2010/0038800 A1 | 2/2010 | Yoon et al. | |
| 2010/0090319 A1 | 4/2010 | Hsu et al. | |
| 2010/0176494 A1 | 7/2010 | Chen | |
| 2010/0276787 A1 | 11/2010 | Yu et al. | |
| 2010/0314758 A1 | 12/2010 | Wu et al. | |
| 2011/0151677 A1 * | 6/2011 | Wang et al. | 438/773 |
| 2013/0052780 A1 * | 2/2013 | Kim et al. | 438/270 |
| 2013/0196082 A1 | 8/2013 | Spence et al. | 427/578 |
| 2013/0207241 A1 * | 8/2013 | Lee et al. | |
| 2013/0207242 A1 * | 8/2013 | Lee et al. | 257/621 |
| 2013/0237045 A1 * | 9/2013 | Kim et al. | 438/589 |
| 2013/0307079 A1 * | 11/2013 | Jagannathan et al. | 257/365 |
| 2013/0309856 A1 * | 11/2013 | Jagannathan et al. | 438/587 |
| 2013/0334650 A1 * | 12/2013 | Liu et al. | 257/506 |
| 2014/0162431 A1 * | 6/2014 | Lin et al. | 438/435 |
| 2014/0191414 A1 * | 7/2014 | Kim | 257/774 |
| 2014/0252428 A1 * | 9/2014 | Chang et al. | 257/288 |

* cited by examiner

SEMICONDUCTOR DEVICES HAVING CONDUCTIVE VIA STRUCTURES AND METHODS FOR FABRICATING THE SAME

CROSS-REFERENCE TO RELATED APPLICATIONS

This U.S. non-provisional patent application claims priority under 35 U.S.C. §119 to Korean Patent Application No. 10-2012-0015238, filed on Feb. 15, 2012, in the Korean Intellectual Property Office, the entire contents of which are hereby incorporated by reference.

BACKGROUND OF THE INVENTION

Embodiments of the inventive concepts relate generally to a semiconductor device and/or methods of fabrication, and more particularly, to semiconductor devices having through electrodes or conductive via structure and/or to methods of fabricating the same.

A process of fabricating a semiconductor device with a through electrode or a through silicon via (TSV) may include protruding the through electrode outward from a bottom surface of a substrate, depositing a conventional chemical vapor deposition (CVD) layer on the bottom surface of the substrate, and then exposing the through electrode using a chemical-mechanical polishing process. The conventional CVD layer may have a poor step coverage property. For example, the conventional CVD layer may be formed to be thicker on the through electrode than on other portions. As a result, a lower insulating layer may be folded and the through electrode may be formed to have a high variation in protruding length thereof. Theses may lead to warpage or breakage of the through electrode in a subsequent planarization process, and thus a production yield may decrease.

SUMMARY

At least one example embodiment relates to a method for fabricating a semiconductor device.

In one embodiment, the method includes forming a conductive via structure in a base layer. The base layer has a first surface and a second surface, and the second surface is opposite the first surface. The method further includes removing the second surface of the base layer to expose the conductive via structure such that the conductive via structure protrudes from the second surface, and forming a first lower insulating layer over the second surface such that an end surface of the conductive via structure remains exposed by the first lower insulating layer.

In another embodiment, the method includes forming a conductive via structure in a base layer. The base layer has a first surface and a second surface, and the second surface is opposite the first surface. The method further includes removing the second surface of the base layer to expose the conductive via structure such that the conductive via structure protrudes from the second surface, and performing flowable chemical vapor deposition to form a first lower insulating layer over the second surface.

At least one example embodiment relates to a semiconductor device.

In one embodiment, the semiconductor device includes a substrate having a first surface with an integrated circuit formed thereon. The substrate has a second surface opposite the first surface. A conductive via structure is disposed in the substrate and protrudes from the second surface. A first lower insulating layer is on the second surface such that at least an end portion of the conductive via structure is exposed.

In another embodiment, the semiconductor device includes a substrate having a first surface with an integrated circuit formed thereon. The substrate has a second surface opposite the first surface. A conductive via structure is disposed in the substrate and protrudes from the second surface. A flowable chemical vapor deposition layer is on the second surface such that at least an end portion of the conductive via structure is exposed.

At least one example embodiment relates to a memory card, an information processing system, etc. including the semiconductor device according to one of the above described embodiments.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 7B is an enlarged sectional view illustrating a portion of FIG. 7A.

FIG. 8B is an enlarged sectional view illustrating a portion of FIG. 8A.

Figure 1:
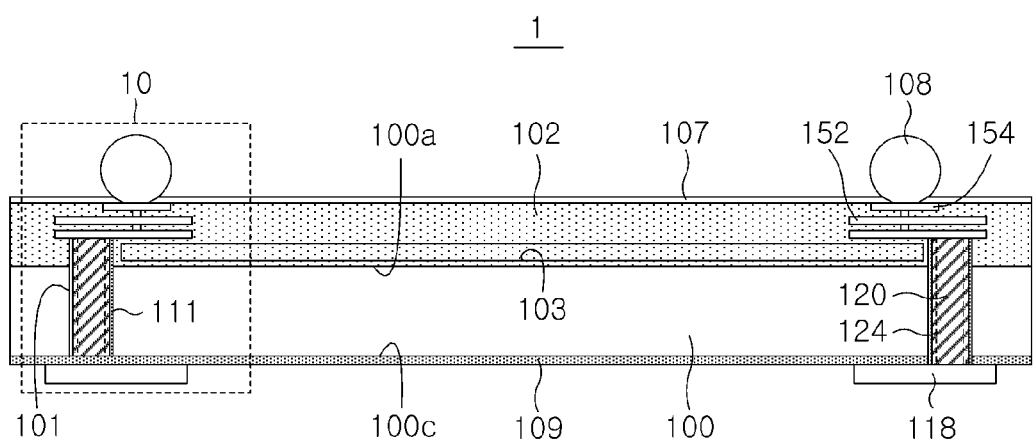
FIG. 1 is a sectional view illustrating a semiconductor device according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Semiconductor Device

Some Example Embodiments

FIG. 1 is a sectional view illustrating a semiconductor device according to an example embodiment of the inventive concepts.

Referring to FIG. 1, a semiconductor device 1 may include an electric connecting portion 10 vertically delivering an electrical signal. The electric connecting portion 10 may include a through electrode or conductive via 120, which may be provided to fill a via hole 101 penetrating a substrate 100 along a substantially vertical direction. A via insulating layer or liner 111 may be provided between the through electrode 120 and the substrate 100 to electrically isolate the through electrode 120 from the substrate 100. A barrier layer 124 may be further provided between the through electrode 120 and the via insulating layer 111 to prevent constituent elements (e.g., copper) of the through electrode 120 from being diffused toward the substrate 100. The conductive via 120, the via insulating layer 111 and the barrier layer 124 may collectively be referred to as a conductive via structure. The semiconductor device 1 may include at least one of an upper terminal 108 and a lower terminal 118, which are electrically connected to the through electrode 120. The upper terminal 108 may be disposed on an active surface 100a of the substrate 100 and the lower terminal 118 may be disposed on an inactive surface 100c of the substrate 100. Each of the upper terminal 108 and the lower terminal 118 may include at least one of a solder ball, a solder bump, a redistribution line, a pad, and so forth. For example, the upper terminal 108 may include a solder ball and the lower terminal 118 may include a pad.

An integrated circuit 103, a metal line 152, and an interlayered insulating layer 102 may be disposed on the active surface 100a of the substrate 100. The metal line 152 may be electrically connected to the integrated circuit 103 and have a single-layered or multi-layered structure. The interlayered insulating layer 102 may be formed to cover the integrated circuit 103 and the metal line 152. An upper insulating layer 107 may be provided on an interlayered insulating layer 102. The upper insulating layer 107 may be formed to expose a bonding pad 154 electrically connected with the upper terminal 108 and the metal line 152. Since the metal line 152 and the through electrode 120 are electrically connected to each other, the integrated circuit 103 and the through electrode 120 may be electrically connected to each other. The through electrode 120 may be disposed around or in the integrated circuit 103. A lower insulating layer 109 may be disposed on the inactive surface 100c of the substrate 100 to expose the through electrode 120.

Figure 4A:
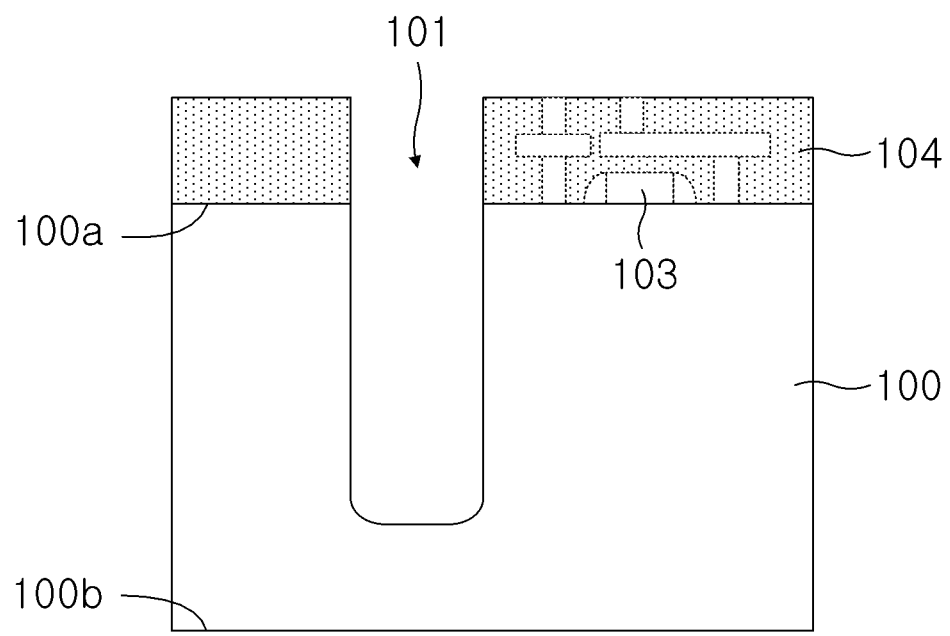
FIGS. 4A through 4H are sectional views illustrating a method of fabricating a semiconductor device according to an example embodiment of the inventive concepts.
Figure 4B:
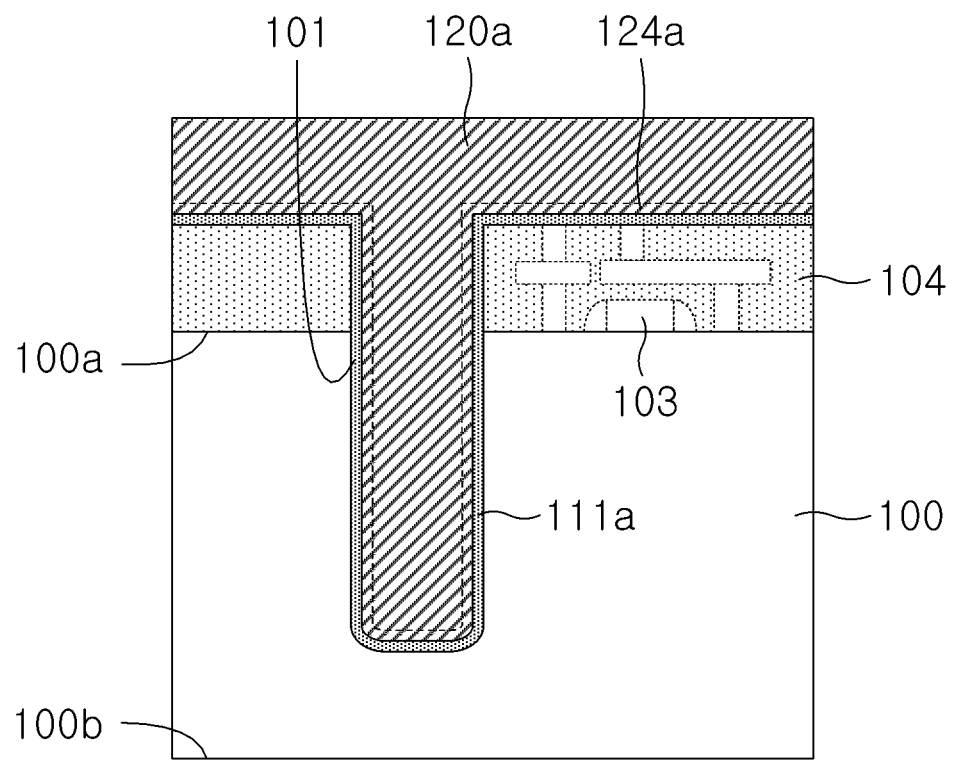
Figure 4C:
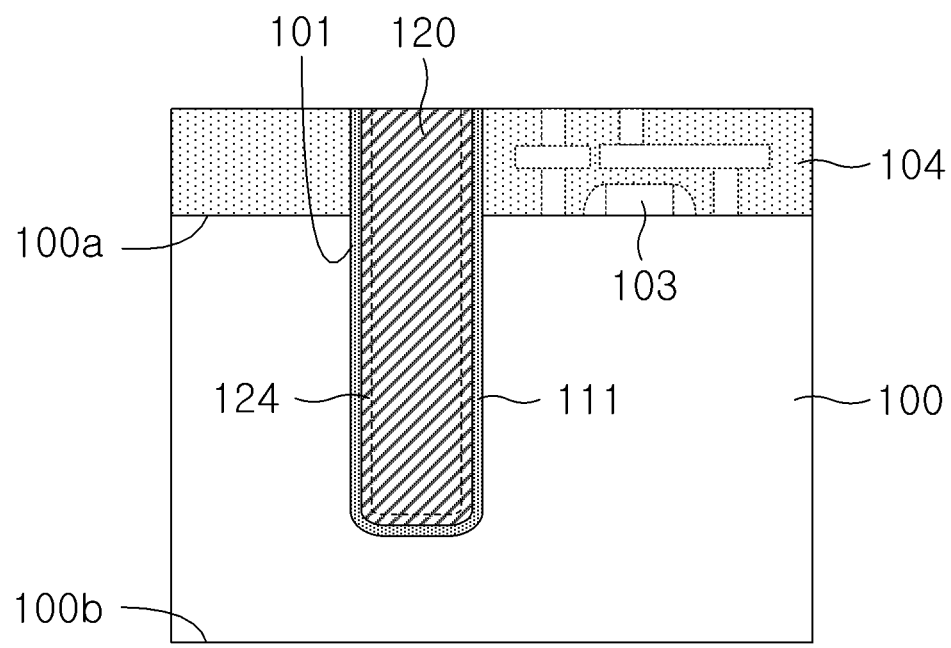
Figure 4D:
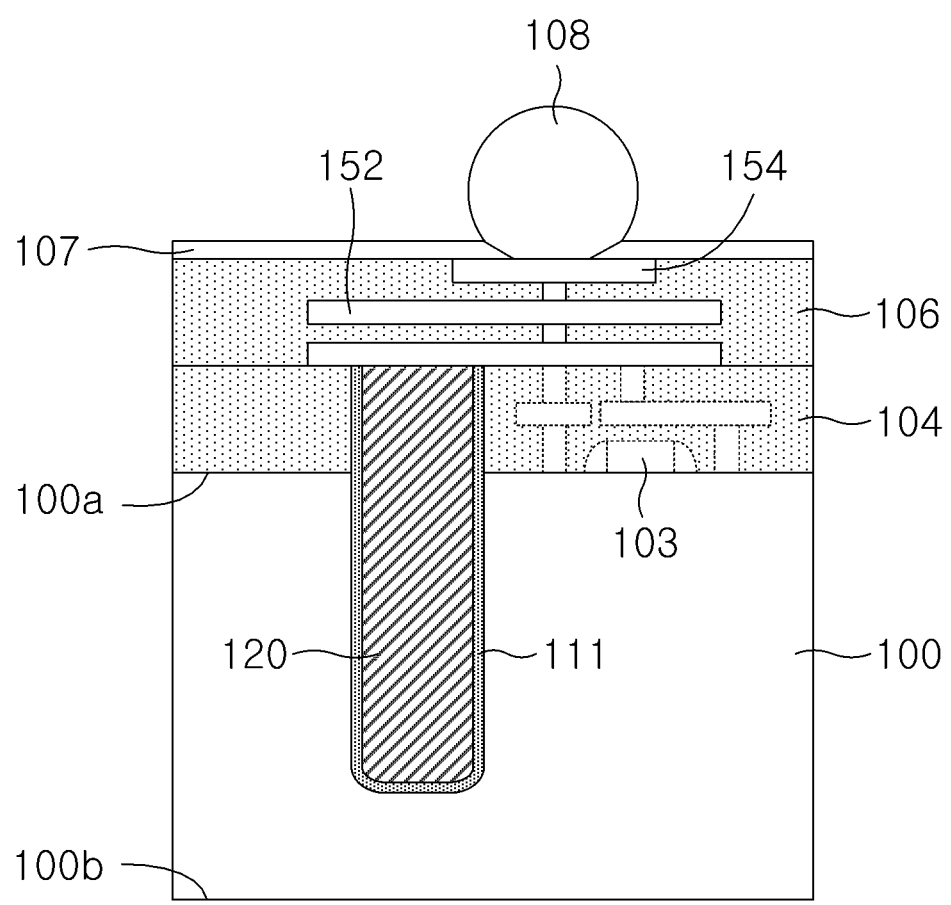
Figure 4E:
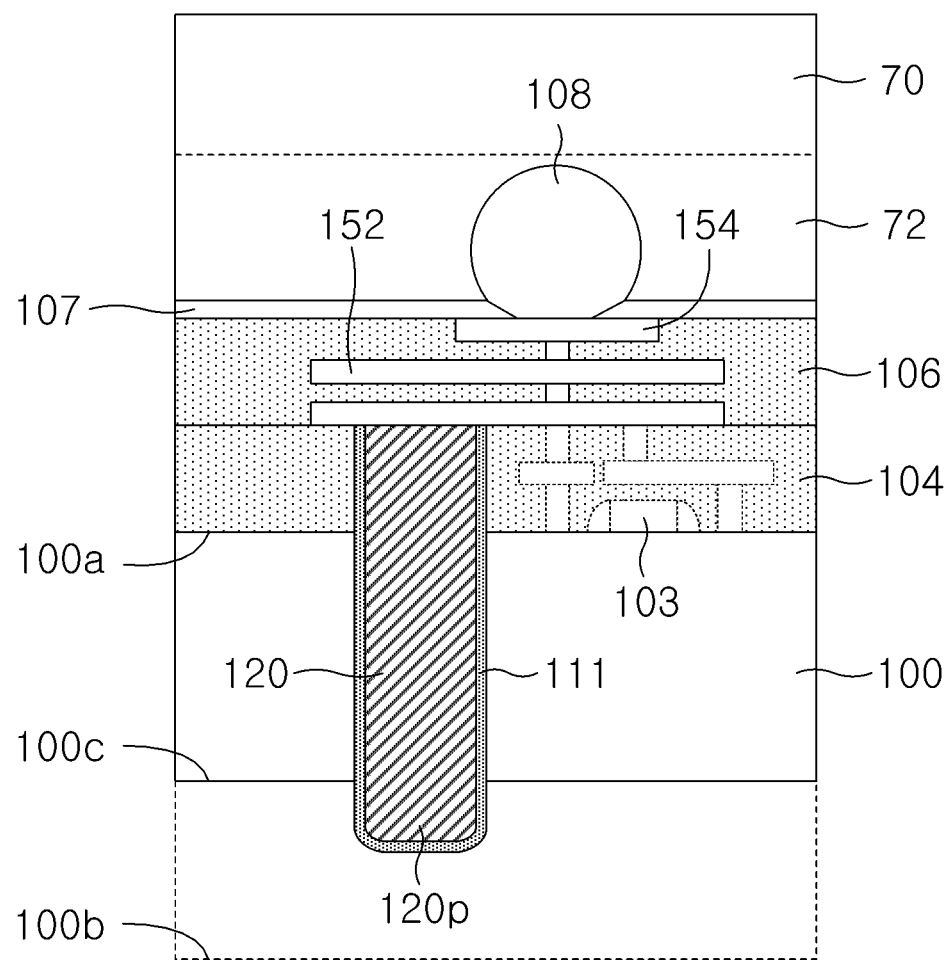
Figure 4F:
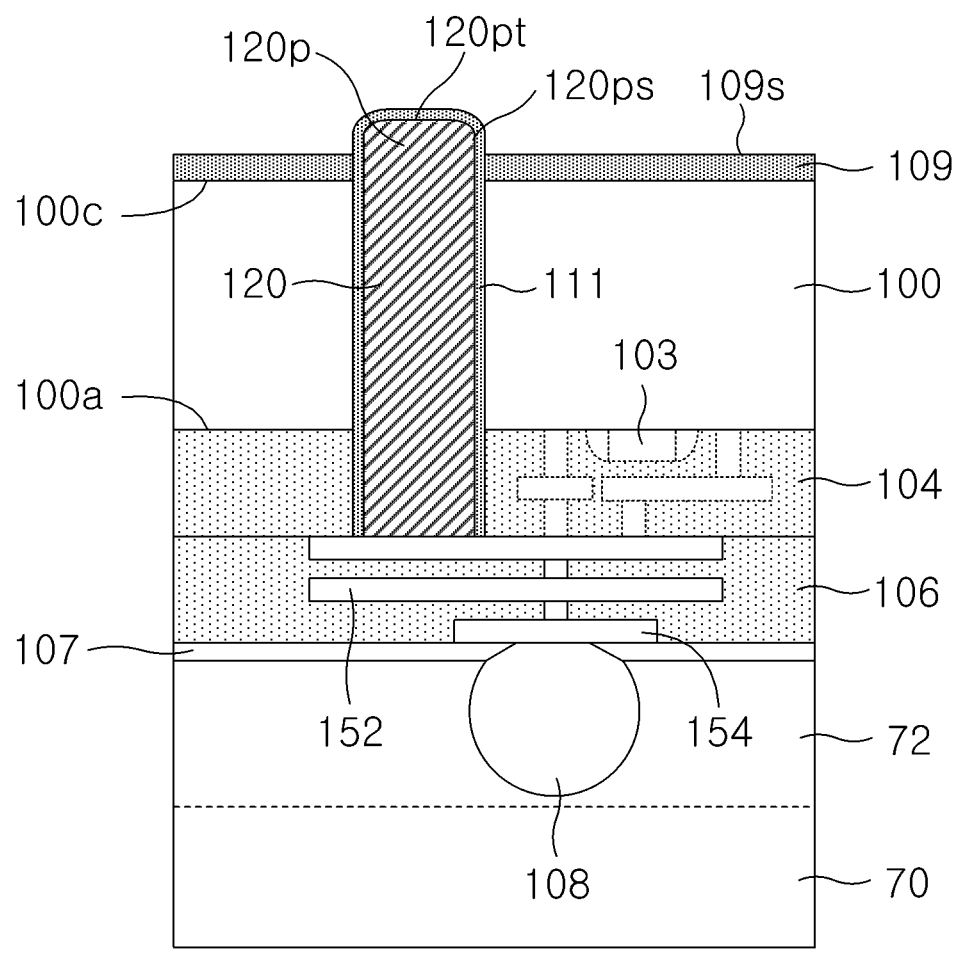
Figure 4G:
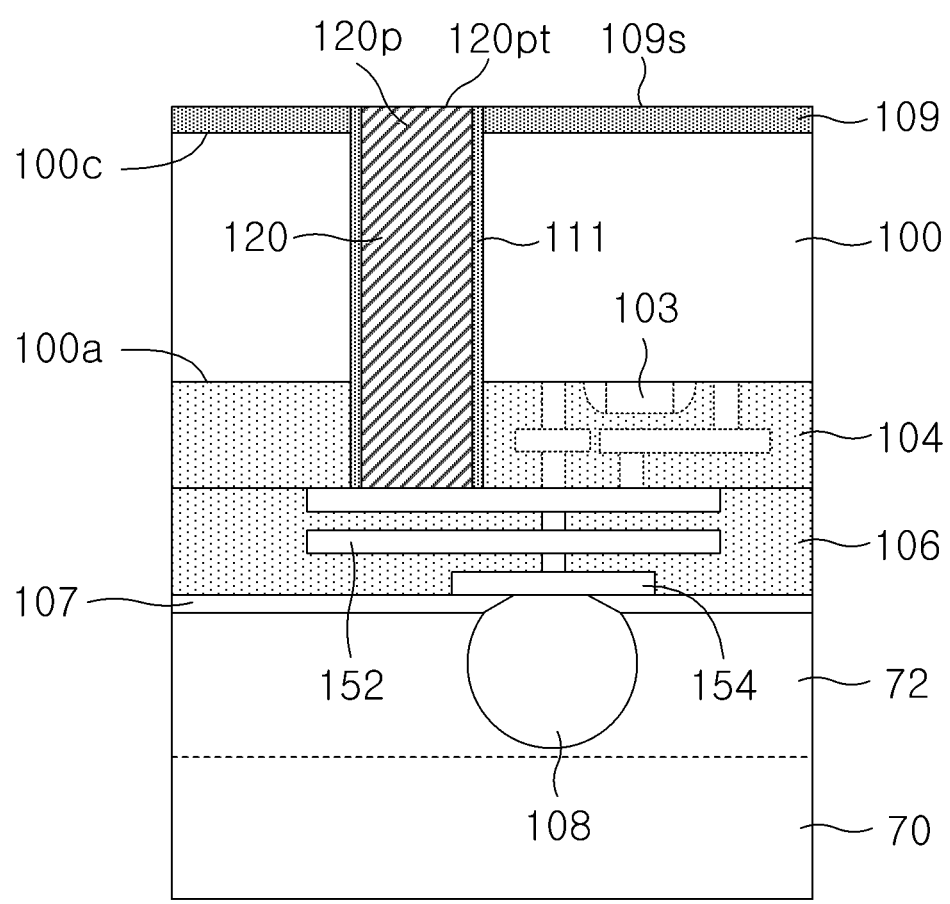

As will be described with reference to FIGS. 4A through 4H, the formation of the semiconductor device 1 may include forming the through electrode 120 to protrude outward from the inactive surface 100c of the substrate 100 (as shown in FIG. 4E), forming the lower insulating layer 109 on the inactive surface 100c (as shown in FIG. 4F), and performing a planarization process to expose the through electrode 120 (as shown in FIG. 4G). According to an example embodiment of the inventive concepts, the lower insulating layer 109 may be formed using a flowable chemical vapor deposition (FCVD). Due to the deposition properties of an FCVD layer, it may be possible to perform processes of protruding and/or planarizing the through electrode 120 with stability.

The electric connecting portion 10 may be configured to have one of various structures, as will be described with reference to FIGS. 2A through 2C.

Electric Connecting Portion

Example Embodiments

Figure 2A:
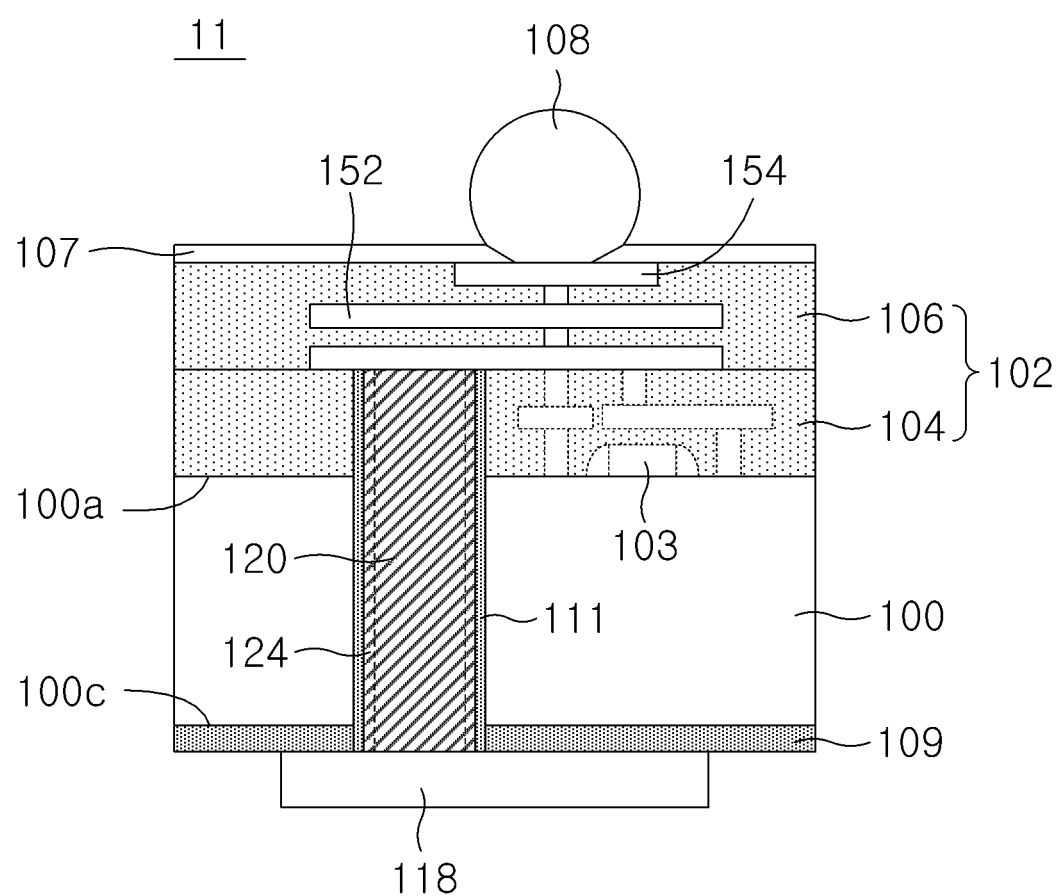
FIGS. 2A through 2C are sectional views illustrating various examples of electric connecting portions provided in semiconductor devices according to some example embodiments of the inventive concepts.
Figure 2B:
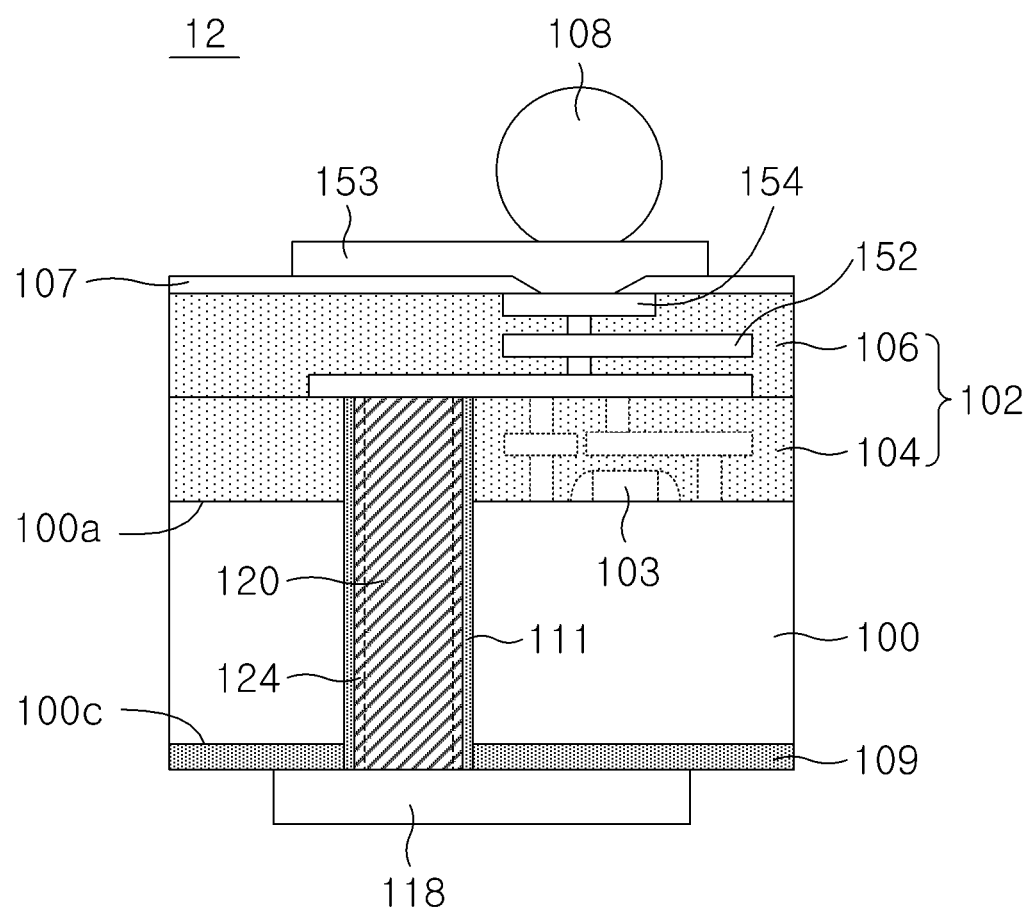
Figure 2C:
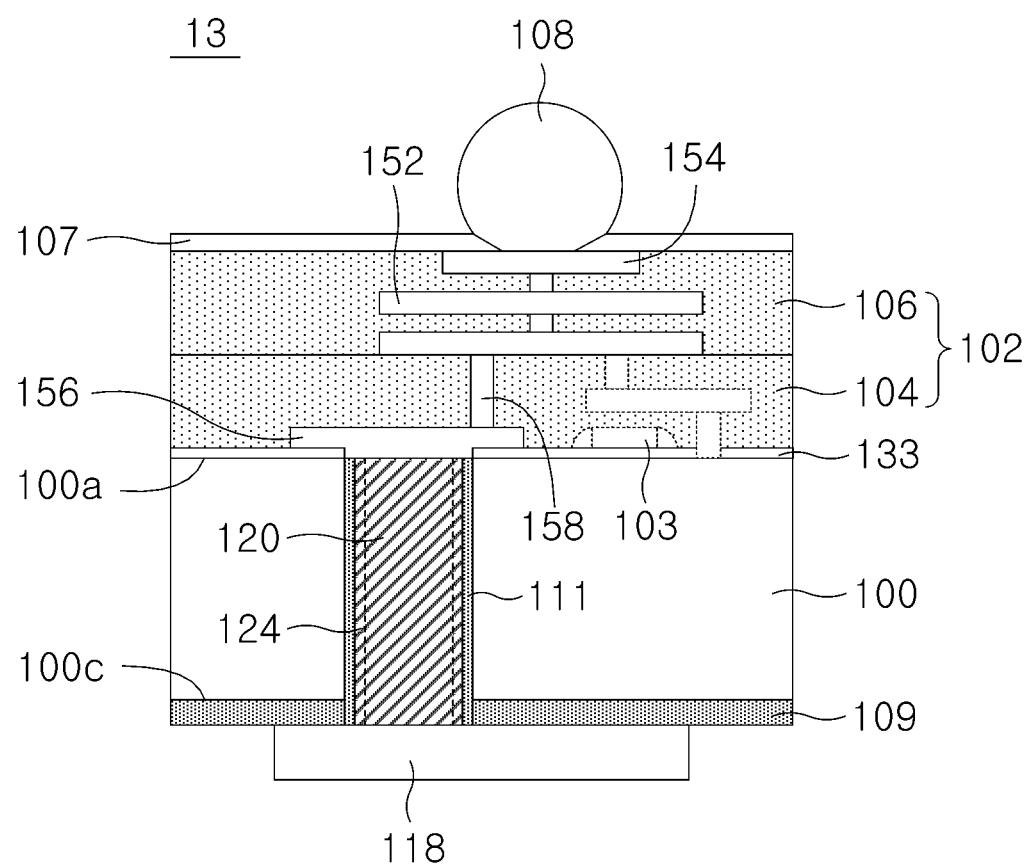

FIGS. 2A through 2C are sectional views illustrating various examples of electric connecting portions provided in semiconductor devices according to some example embodiments of the inventive concepts.

Referring to FIG. 2A in conjunction with FIG. 1, an electric connecting portion 11 may be a Via Middle structure including the through electrode 120, which may be formed after the formation of the integrated circuit 103 and before the formation of the metal line 152. The interlayered insulating layer 102 may include a first interlayered insulating layer 104 formed on the active surface 100a of the substrate 100 to cover the integrated circuit 103 and a second interlayered insulating layer 106 formed on the first interlayered insulating layer 104 to cover the metal line 152 and the bonding pad 154. The through electrode 120 may be electrically connected to the lower terminal 118 through the first interlayered insulating layer 104, the substrate 100 and the lower insulating layer 109. For example, the through electrode 120 may be formed to have a pillar shape. The lower terminal 118 may be a redistribution pad electrically connecting the through electrode 120 to one or more other terminals which are not aligned with the through electrode 120.

Figure 5A:
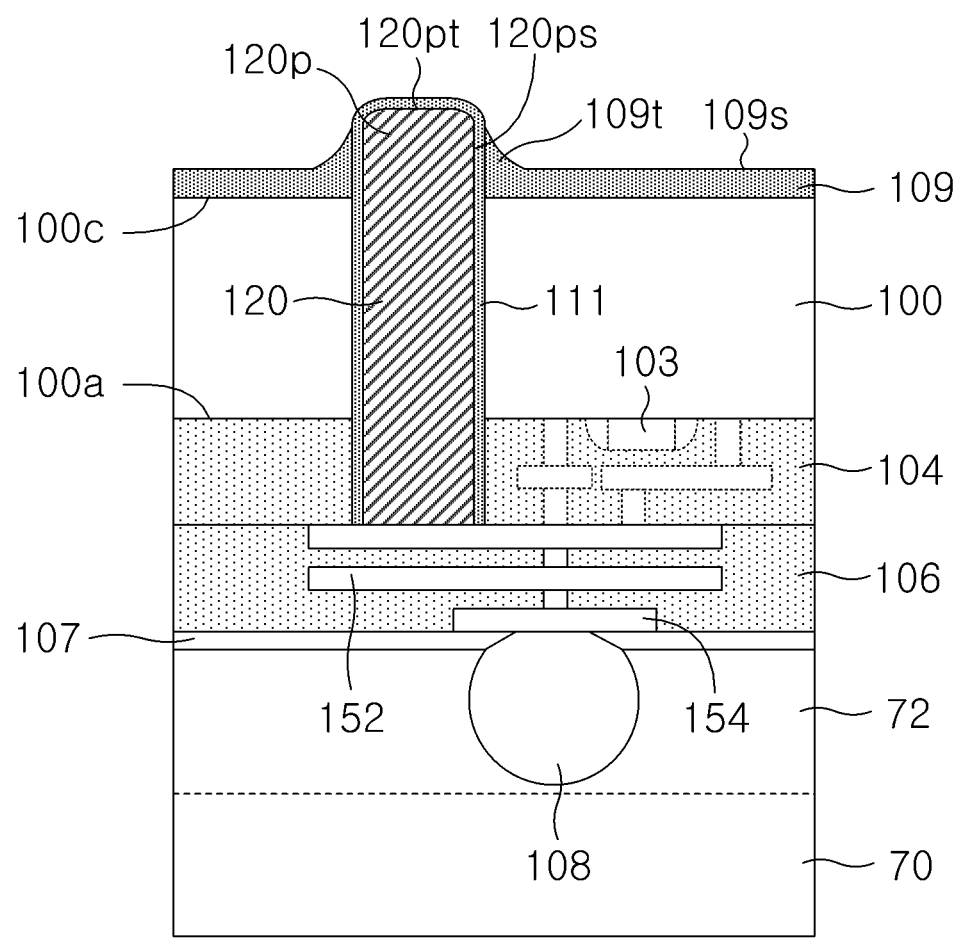
FIGS. 5A through 5C are sectional views exemplarily illustrating a method of fabricating a semiconductor device according to another example embodiment of the inventive concepts.
Figure 5B:
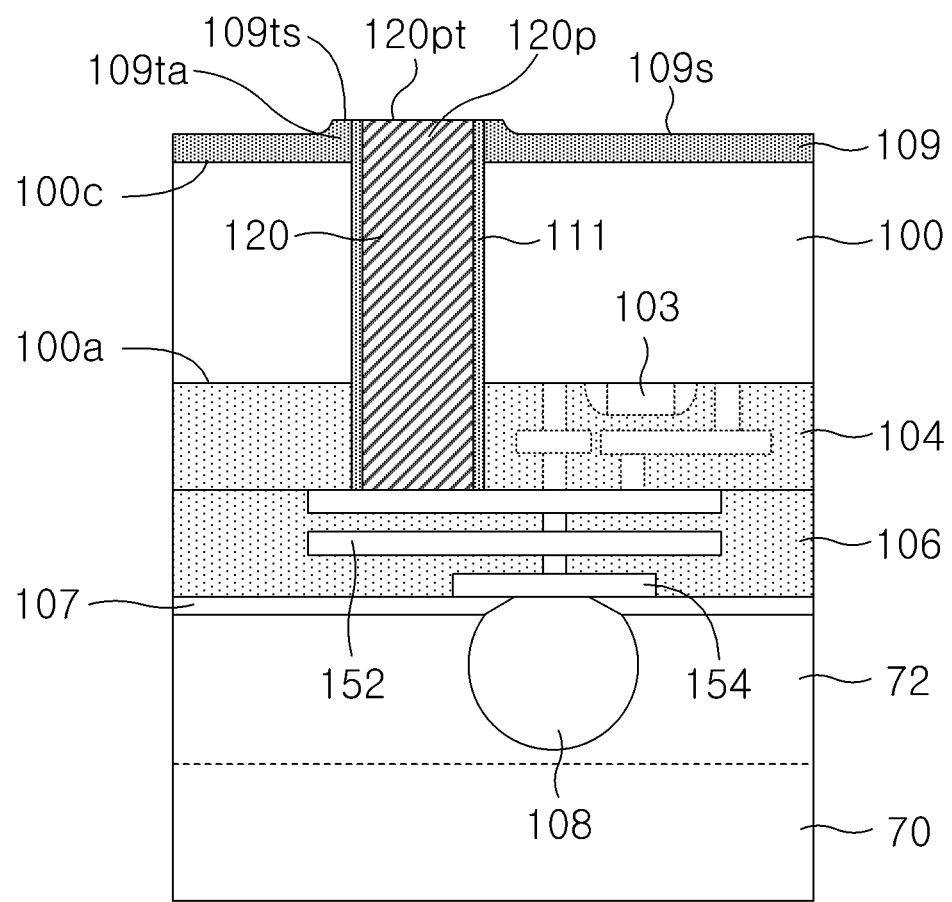
Figure 5C:
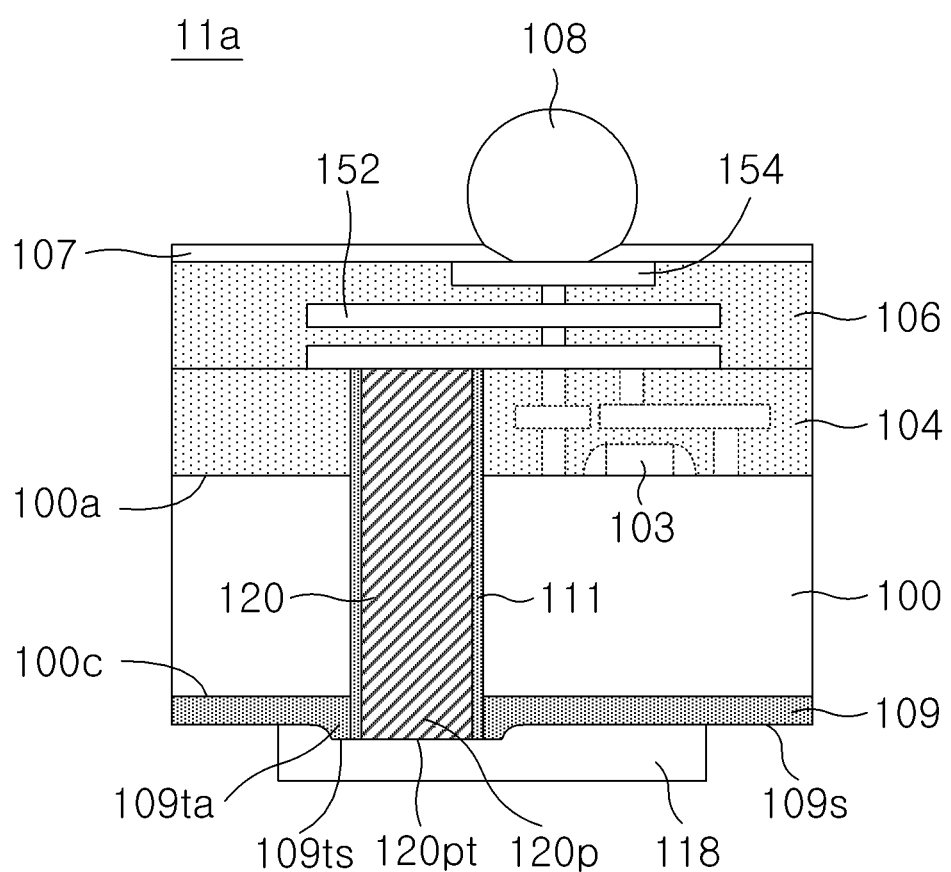

In other embodiments, as shown in FIG. 5C, the lower insulating layer 109 may be an FCVD layer including a half tail 109ta, which may cover a sidewall of a lowermost portion 120p of the through electrode 120. In still other embodiments, as shown in FIG. 6C, the lower insulating layer 109 may be an FCVD layer, having a tail 109t covering the sidewall of the lowermost portion 120p of the through electrode 120. The lower terminal 118 may be provided in a form of a metal bump 118a electrically connected with the lowermost portion 120p of the through electrode 120. A solder 118b may be further provided on the metal bump 118a. In yet other embodiments, as shown in FIG. 7D, provided is a planarized lower insulation structure, in which the lower insulating layer 109 formed of an FCVD layer may be buried in a second lower insulating layer 119 formed of the conventional CVD layer. In even other embodiments, as shown in FIG. 8D, provided is a planarized lower insulation structure, in which a second lower insulating layer 119' formed of the conventional CVD layer may be stacked on the lower insulating layer 109 formed of an FCVD layer. At least one of the structures shown in FIGS. 5C, 6C, 7D, and 8D may also be applied to realize a Via Last structure and a Via First structure to be described below.

Referring to FIG. 2B, a via last structure is shown. The via last structure is the same as the via middle structure shown in FIG. 2B; however, the through electrolode 120 is formed after the interlayered insulating layer 102 and associated structures. For example, the through electrolode 120 may be formed after the integrated circuit 103 and the metal line 152 are formed.

Referring to FIG. 2C, an electric connecting portion 13 may be a Via First structure including the integrated circuit 103 and the metal line 152, which may be formed after the formation of the through electrode 120. A connecting line 156 may be further provided on the active surface 100a of the substrate 100 with an insulating layer 133 interposed therebetween. The connecting line 156 may be electrically connected to the through electrode 120. In example embodiments, the through electrode 120 may be shaped as a pillar penetrating the substrate 100 and be electrically connected to the metal line 152 and/or the integrated circuit 103 via a connecting via 158 which connects the connecting line 156 to the metal line 152.

Semiconductor Package

Some Example Embodiments

Figure 3:
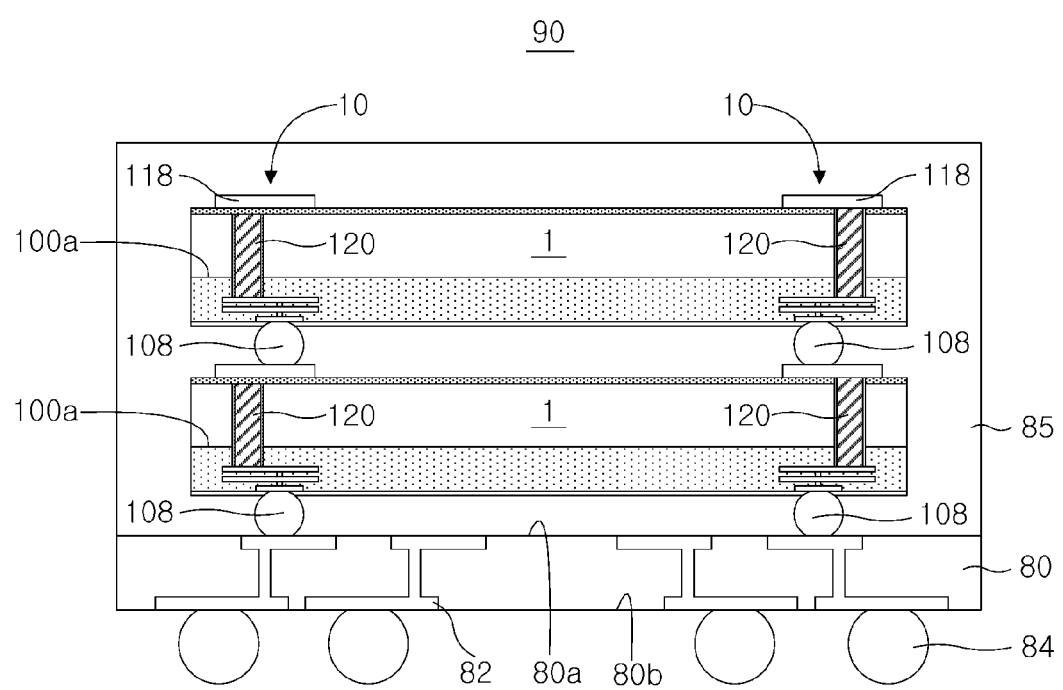
FIG. 3 is a sectional view illustrating a semiconductor package including the semiconductor device of FIG. 1.

FIG. 3 is a sectional view illustrating a semiconductor package including the semiconductor device of FIG. 1.

Referring to FIG. 3, a semiconductor package 90 may include a package substrate 80 and at least one of the semiconductor devices 1 of FIG. 1 mounted on the package substrate 80. The semiconductor package 90 may further include a molding layer 85 to mold the semiconductor devices 1. The package substrate 80 may be a printed circuit board (PCB) including a top surface 80a, a bottom surface 80b oppositely facing from the top surface 80a, and electric connection lines 82 disposed therein. The semiconductor devices 1 may be mounted on the top surface 80a of the package substrate 80 in a face-down manner such that the active surfaces 100a may face the package substrate 80. The semiconductor package 90 may further include at least one solder ball 84 attached to the bottom surface 80b of the package substrate 80 and connected to the electric connection line 82. In example embodiments, the through electrode 120 may accomplish electric connections between the semiconductor devices 1 and between the semiconductor devices 1 and the package substrate 80. The semiconductor devices 1 may be configured to include at least one of the electric connecting portions described in the present specification.

Fabrication Method

Some Example Embodiments

FIGS. 4A through 4H are sectional views illustrating a method of fabricating a semiconductor device according to an example embodiment of the inventive concepts.

Referring to FIG. 4A, the via hole 101 may be formed in the substrate 100. The substrate 100 may be a semiconductor substrate (for example, a silicon substrate) having the top surface 100a on which the integrated circuit 103 is provided and a first bottom surface 100b opposite the top surface 100a. The first interlayered insulating layer 104 may be formed on the top surface 100a of the substrate 100 to cover the integrated circuit 103 prior to forming the via hole 101. The integrated circuit 103 may be configured to include a memory circuit, a logic circuit, or a combination thereof. The first interlayered insulating layer 104 may be formed by depositing a silicon oxide layer or a silicon nitride layer. The via hole 101 may be formed to have a hollow pillar shape having an entrance near the top surface 100a of the substrate 100. The via hole 101 may have a depth not to reach the first bottom surface 100b of the substrate 100. The via hole 101 may extend from the top surface 100a of the substrate 100 toward the first bottom surface 100b in a substantially vertical direction. The via hole 101 may be formed by performing a dry etching process or a drilling process on the first interlayered insulating layer 104 and the substrate 100. In example embodiments, the via hole 101 may be formed at a region near the integrated circuit 103 (for example, a scribe lane or a region adjacent thereto) or at a region provided with the integrated circuit 103.

Referring to FIG. 4B, an insulating layer 111a may be formed to cover conformally the structure provided with the via hole 101, and a conductive layer 120a may be formed on the substrate 100 to fill the via hole 101. The insulating layer 111a may be formed by depositing a silicon oxide layer or a silicon nitride layer using the conventional CVD process, for example, a plasma-enhanced CVD (PECVD). The conductive layer 120a may be formed by depositing or plating a layer of polysilicon, copper, tungsten, aluminum, and so forth. In the case in which the conductive layer 120a is formed of a copper layer or a copper-containing conductive material, a metal layer 124a capable of preventing copper diffusion may be formed on the insulating layer 111a. The metal layer 124a may be formed by depositing a metal layer containing at least one of titanium, titanium nitride, chromium, tantalum, tantalum nitride, nickel, and any combination thereof. The metal layer 124a may be formed to cover conformally the structure provided with the insulating layer 111a. Although not depicted in the drawings, in the case in which the conductive layer 120a is formed using a plating process, a seed layer may be further formed before the formation of the conductive layer 120a.

Referring to FIG. 4C, the conductive layer 120a and the insulating layer 111a may be planarized to expose the first interlayered insulating layer 104. The planarization may be performed using at least one of an etch-back process and a chemical-mechanical polishing process. As the result of the planarization on the conductive layer 120a and the insulating layer 111a, the through electrode 120 shaped like a pillar may be formed to penetrate the substrate 100 and the first interlayered insulating layer 104 in a substantially vertical direction, and the via insulating layer 111 may be formed to isolate the through electrode 120 electrically from the substrate 100. In the case in which the metal layer 124a is additionally formed, the barrier layer 124 may be formed by the planarization on the metal layer 124a and prevent constituent elements (e.g., Cu) of the through electrode 120 from being diffused toward the substrate 100 or the integrated circuit 103. Hereinafter, the barrier layer 124 may be omitted from the drawings.

Referring to FIG. 4D, a back-end process may be performed. For example, the metal line 152 of a single-layered or multi-layered structure coupled to the through electrode 120, the bonding pad 154 electrically connected to the metal line 152, and the second interlayered insulating layer 106 covering the metal line 152 and the bonding pad 154 may be formed on the first interlayered insulating layer 104. The metal line 152 and the bonding pad 154 may be formed by depositing and patterning a metal layer (e.g., of copper or aluminum). The second interlayered insulating layer 106 may be formed by depositing an insulating material (e.g., of silicon oxide or silicon nitride), for example, using CVD. In at least one example embodiment, the second interlayered insulating layer 106 may be formed of the same or similar material as the first interlayered insulating layer 104. The upper insulating layer 107 may be formed on the second interlayered insulating layer 106. The upper insulating layer 107 may be formed by depositing a layer (e.g., of silicon oxide, silicon nitride, or polymer) and patterning the layer to expose the bonding pad 154. In an example embodiment, a bump process may be further performed to form the upper terminal 108 (e.g., a solder ball or a solder bump) coupled to the bonding pad 154.

Referring to FIG. 4E, a process of thinning the substrate 100 may be performed to make the through electrode 120 protrude from the substrate 100. For example, the bottom surface 100b of the substrate 100 may be recessed or removed by at least one of an etching process, a CMP process, and a grinding process using etchant or slurry capable of selectively removing the substrate 100 (e.g., of silicon). This process may be performed to provide a second bottom surface 100c, which may be closer to the top surface 100a compared with the first bottom surface 100b. As a result, the lowermost portion 120p of the through electrode 120 may protrude from the second bottom surface 100c. The recess/removal process may be performed in a state that a supporting plate 70 is attached to the top surface 100a of the substrate 100 with an adhesion layer 72 interposed therebetween. The recess/removal process may be performed in a state that the top surface 100a of the substrate 100 faces upward or downward. In this specification, the top surface 100a of the substrate 100 may be an active surface and the second bottom surface 100c may be an inactive surface.

Referring to FIG. 4F, the substrate 100 may be inverted, and then the lower insulating layer 109 may be formed by a silicon oxide layer or a silicon nitride layer on the second bottom surface 100c of the substrate 100. The recess/removal process may be performed in a state that the supporting plate 70 is attached to the substrate 100. The lower insulating layer 109 may be formed by depositing an insulating material using a spin coating process, a spray coating process, a spin-on-glass (SOG) process, or a FCVD process. In this example embodiment, the lower insulating layer 109 may be formed using the FCVD process, but example embodiments of the inventive concepts may not be limited thereto.

The FCVD process may include providing a silicon-containing compound (e.g., organo-silane or organo-siloxane) and an oxidizing agent/oxidant (e.g., ethanol or isopropyl alcohol) on the second bottom surface 100c of the substrate 100, condensing the silicon-containing compound and the oxidizing agent/oxidant to deposit a flowable layer with Si—O, Si—H, and/or Si—OH bonds, and converting the flowable layer into a solid silicon oxide layer (e.g., SiO2). Depositing the flowable layer may be performed under the condition of low temperature (e.g., 20-150° C.) and low pressure (e.g., 1~100 Torr), without the use of plasma. The converting may be performed in a plasma environment (e.g., of oxygen, helium, argon plasma) of about 200° C. and low pressure (e.g., of about 10 Torr or less) or be achieved by annealing. The annealing may be performed at low temperature (e.g., of 200° C. or less). As the result of the converting, the flowable layer may be solidified and shrunk to form the silicon oxide layer.

According to the process conditions, the lower insulating layer 109 may have a variety of shapes or thicknesses, etc. For example, the flowable layer may have flowability depending on the process condition, and thus, by adjusting the FCVD process, the lower insulating layer 109 may be formed on the second bottom surface 100c of the substrate 100 to have an improved flatness. In an example embodiment, the lower insulating layer 109 may extend along the second bottom surface 100c of the substrate 100 to have a substantially flat surface 109s, which may be lower than a lowermost surface 120pt of the lowermost portion 120p of the through electrode 120. Stated another way, the surface 109s may be closer to the second bottom surface 100c of the substrate 100 than the lowermost surface 120p. In other words, the lower insulating layer 120 may not cover the lowermost surface 120pt and a side surface 120ps of the lowermost portion 120p of the through electrode 120.

Unlike the afore-described embodiments, in the case in which the lower insulating layer is formed using the conventional CVD process, the lower insulating layer may be formed to have a shape surrounding the lowermost portion 120p of the through electrode 120. In this case, the lower insulating layer may be thicker on the lowermost surface 120pt of the lowermost portion 120p of the through electrode 120 than on other positions (e.g., on the second bottom surface 100c of the substrate 100). Due to the poor step coverage property, the lower insulating layer may be folded at an interfacial region between the through electrode 120 and the second bottom surface 100c of the substrate 100, thereby having a folded portion (e.g., 119f of FIG. 7A). Furthermore, the poor step coverage of the lower insulating layer may lead to an increase in a protruding length variation of the through electrode 120. The folding of the lower insulating layer and the increased variation in the protruding length of the through electrode 120 may cause warpage or breakage of the through electrode 120 during a planarization process. In addition, since the conventional CVD process is generally performed at a high temperature (e.g., of 400° C. or more), a thermal stress may be applied to the substrate 100 and the integrated circuit 103. Furthermore, thermal stability of the adhesion layer 72 may be deteriorated by the conventional CVD process of high temperature. In this case, the supporting plate 70 may be detached from the substrate 100 or have a reduced adhesive strength with respect to the substrate 100, which may lead to failure or accident in a fabricating process. In this sense, a material with improved thermal stability is desirable for the adhesion layer 72.

For example, the FCVD process, as described in the present embodiment, can be used to form the lower insulating layer 109 locally covering the second bottom surface 100c of the substrate 100 and having a good step coverage property and to improve uniformity in the protruding length of the through electrode 120. In addition, since the FCVD process can be performed at a low temperature (e.g., of 200° C. or less), it may be possible to diminish the risk of thermal stress caused by a high temperature process. In other words, if the semiconductor devices (for example, shown in FIG. 1 or FIG. 3) are fabricated using a low temperature process (for example, the FCVD process described in the example embodiment of the inventive concepts), it may be possible to have technical advantages, such as reduction in heat budget and thermal deterioration of the semiconductor device. Furthermore, the FCVD process can be performed at a low temperature that may not cause a reduction in thermal stability of the adhesion layer 72. Accordingly, the supporting plate 70 can support the substrate 100 stably and materials suitable for the adhesion layer 72 may be diversified.

A Fourier transform-infrared spectroscopy (FT-IR) may be used to determine whether the lower insulating layer 109 is an FCVD layer or not. For example, there is an N-H peak in the FT-IR on an FCVD silicon oxide (SiO2) layer, while there is no N-H peak in the FT-IR on a conventional silicon oxide layer (such as, TEOS or PECVD) formed by a conventional CVD process. Alternatively, an wet etch rate may be used as a parameter for determining whether the lower insulating layer 109 is an FCVD layer or not. For example, in an etching process using a 200:1 diluted HF solution, the FCVD silicon oxide (SiO2) layer may exhibit an wet etch rate of about 130 Å/min, while the TEOS layer may exhibit an wet etch rate of about 80 Å/min.

Referring to FIG. 4G, the second bottom surface 100c of the substrate 100 may be planarized, for example, using a chemical-mechanical polishing (CMP) process. The lower insulating layer 109 may be formed of a FCVD layer as described above, and this may enable to prevent or suppress the through electrode 120 from being warped or broken during the planarization. As the result of the planarization, the lowermost portion 120p of the through electrode 120 may be recessed/removed and exposed. The lower insulating layer 109 may be formed to have a shape horizontally extending along the second bottom surface 100c of the substrate 100.

The lowermost surface 120pt of the lowermost portion 120p of the through electrode 120 may be coplanar with the surface 109s of the lower insulating layer 109.

Figure 4H:
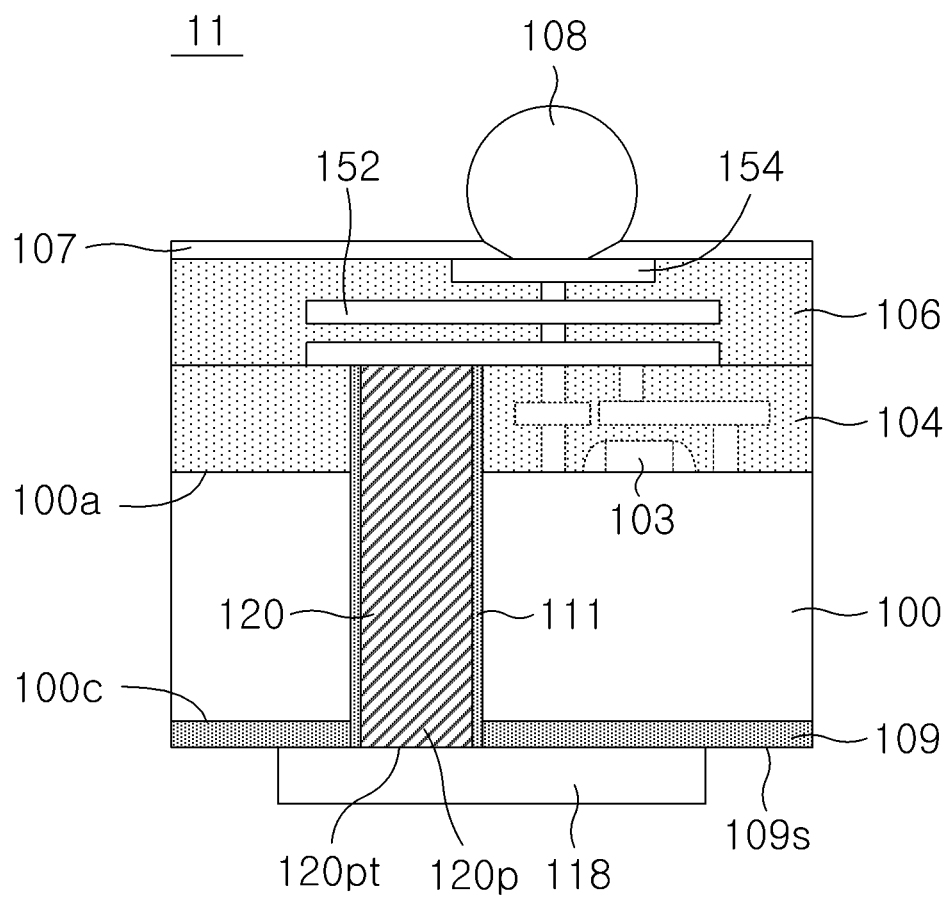

Referring to FIG. 4H, the lower terminal 118 coupled to the lowermost portion 120p of the through electrode 120 may be formed on the lower insulating layer 109. For example, the lower terminal 118 may be formed by depositing and patterning a metal layer (e.g., copper, aluminum, etc.) to have a pad shape. The lower terminal 118 may serve as a redistribution line such that the through electrode 120 may be electrically connected to another terminal which is not aligned with the through electrode 120. The supporting plate 70 may be removed. As a result of the above described process steps, the semiconductor device 1 of FIG. 1 may be fabricated to include the electric connecting portion 11 with the Via Middle structure of FIG. 2A.

In other embodiments, the through electrode 120 may be formed after forming the integrated circuit 103 and a metal line 152, and in this case, the semiconductor device 1 of FIG. 1 may be fabricated to form the electric connecting portion 12 with the Via Last structure of FIG. 2B. In still other embodiments, the integrated circuit 103 and the metal line 152 may be formed after the formation of the through electrode 120, and in this case, the semiconductor device 1 of FIG. 1 may be fabricated to to form the electric connecting portion 13 with the Via First structure of FIG. 2C.

Figure 4I:
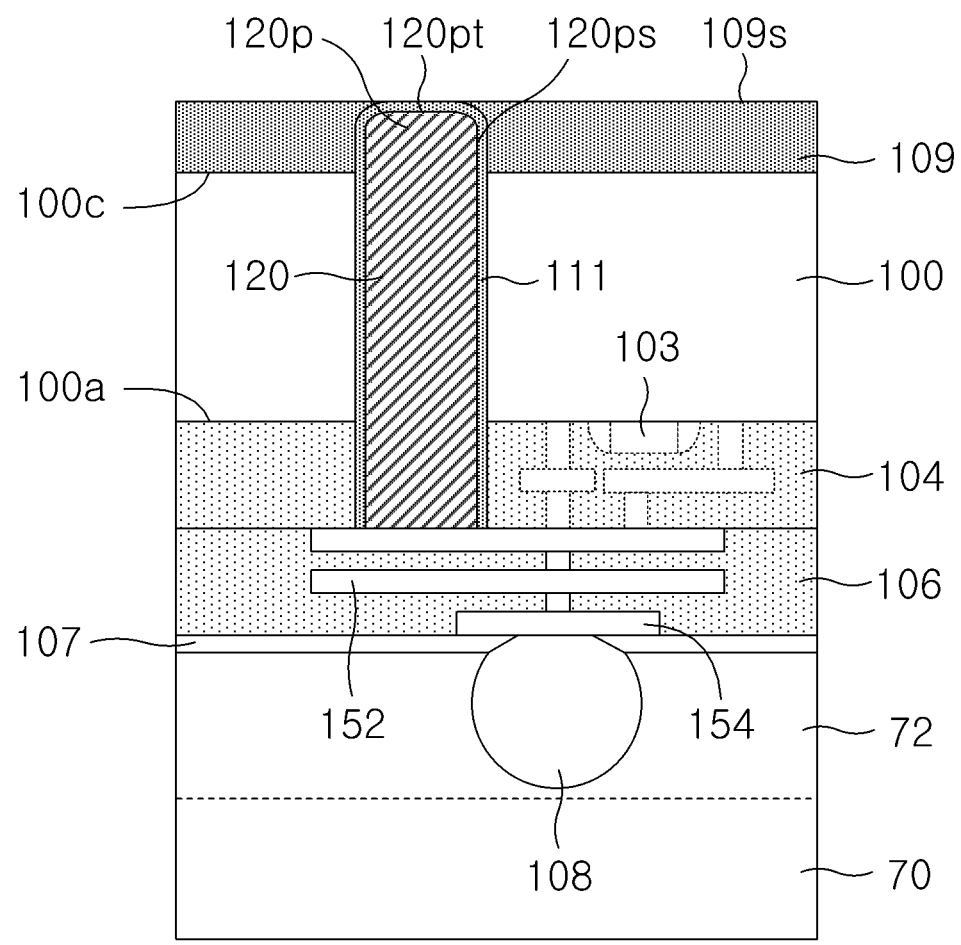
FIGS. 4I-4K illustrate alternate embodiments of the method of fabricating a semiconductor device.
Figure 4J:
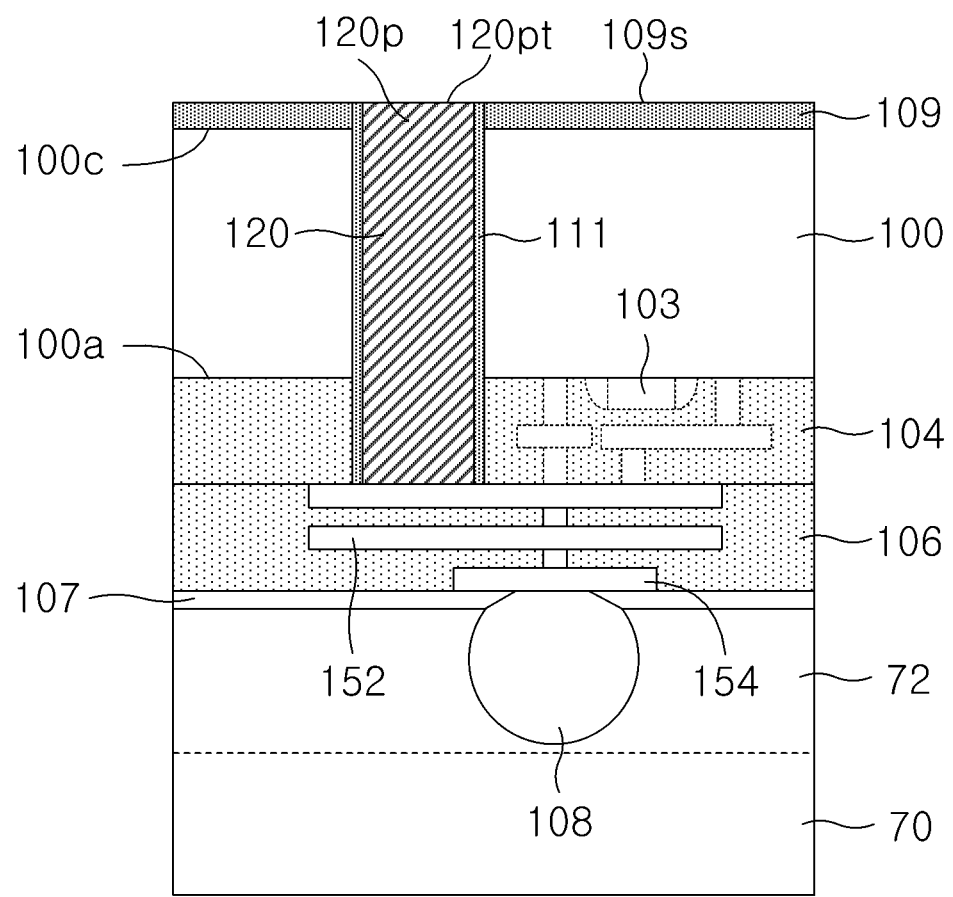
Figure 4K:
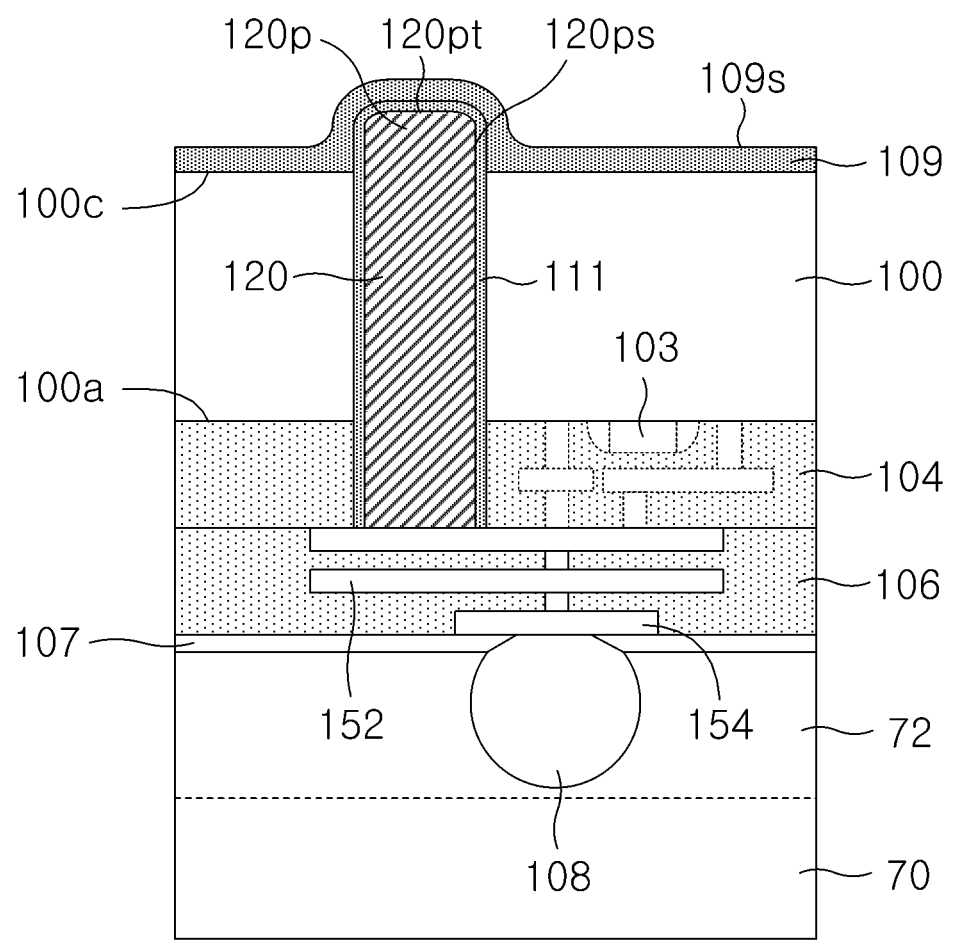

FIGS. 4I-4K illustrate alternative embodiments of the method of fabricating a semiconductor device. As shown in FIG. 4I, instead of forming the lower insulating layer 109 as in FIG. 4F, the lower insulating layer 109 may be formed by FCVD to a thickness that completely covers sidewalls of the through electrode 120p protruding from the substrate 100. In this embodiment, only an end surface of the through electrode 120pt, albeit covered by the liner 111, remains exposed. Processing may continue as described with respect to FIG. 4G. Alternatively, the liner 111 may simply be removed, and processing proceed as described with respect to FIG. 4H.

As shown in FIG. 4J, the liner 111 may be removed from the end of the conductive via 120 such that the end surface of the conduct via 120 is exposed. Then, the lower insulating layer 109 may be formed by FCVD to a thickness that completely covers sidewalls of the through electrode 120p protruding from the substrate 100. In this embodiment, because of the excellent flatness characteristics of the FCVD layer 109, no planarization steps are needed. Processing may then proceed as described with respect to FIG. 4H.

As shown in FIG. 4K, the lower insulating layer 109 formed by FCVD may cover the through electrode 120. Here, processing may then continue as described with respect to FIG. 4G. It will also be appreciated that the alternative embodiments of FIGS. 4I-4K may be applicable to some of the later described embodiments.

Fabrication Method

Other Example Embodiments

Figure 5D:
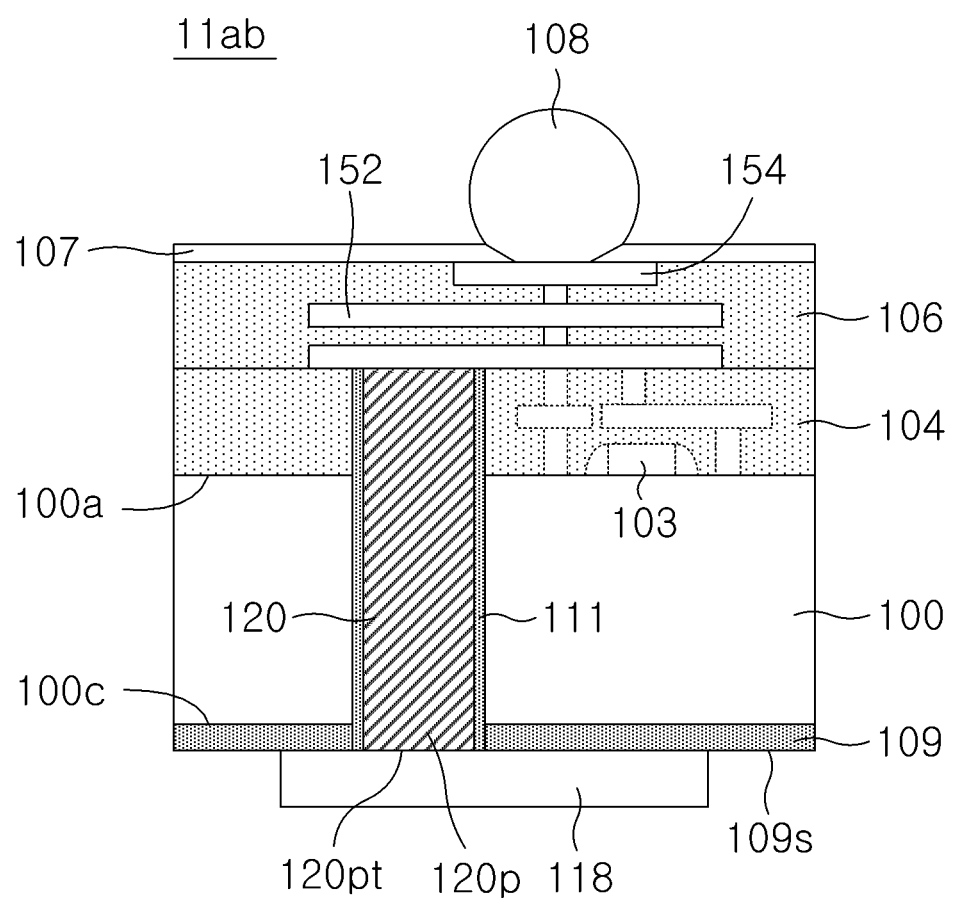
FIG. 5D is a sectional view illustrating a modified example of FIG. 5C.

FIGS. 5A through 5C are sectional views illustrating a method of fabricating a semiconductor device according to other example embodiments of the inventive concepts. FIG. 5D is a sectional view illustrating a modified example of FIG. 5C.

Referring to FIG. 5A, after the formation of the integrated circuit 103 on the top surface 100a of the substrate 100, the through electrode 120 may be formed to penetrate the substrate 100, and the metal line 152 may be formed to connect electrically the integrated circuit 103 and the through electrode 120 with each other, similar or identical to the previous embodiments described with reference to FIGS. 4A through 4E. In other embodiments, the through electrode 120 may be formed after the formation of the integrated circuit 103 and the metal line 152. In still other embodiments, the integrated circuit 103 and the metal line 152 may be formed after the formation of the through electrode 120.

The substrate 100 may be recessed/removed to protrude the through electrode 120 outward from the second bottom surface 100c. The lower insulating layer 109 may be formed on the second bottom surface 100c of the substrate 100 using the FCVD process. The lower insulating layer 109 may be formed not to cover the lowermost surface 120pt of the lowermost portion 120p of the through electrode 120. According to the process condition of the FCVD process, the lower insulating layer 109 may be formed to include the tail 109t adjacent to the through electrode 120. The tail 109t may extend from the surface 109s of the lower insulating layer 109 along the side surface 120ps of the lowermost portion 120p of the through electrode 120, thereby having a vertically tapered shape. For example, the tail 109t may have a horizontal width decreasing toward the lowermost surface or distal end 120pt of the through electrode 120, thereby having a vertical section shaped like a right-angled triangle or having a conical outer profile. In some aspects of the embodiments, the through electrode 120 may have a central axis coincident with the tail 109t and the side surface 120ps of the lowermost portion 120p may be surrounded by the tail 109t.

Referring to FIG. 5B, a planarization process may be performed on the second bottom surface 100c of the substrate 100. The planarization process may be performed using a CMP process. The lowermost portion 120p of the through electrode 120 may be recessed/removed and exposed by the planarization process. The through electrode 120 may be supported by the tail 109t, and this may enable to prevent the through electrode 120 from being warped or broken by a mechanical stress during the CMP process. In example embodiments, a portion of the tail 109t may be removed during the planarization process, thereby forming the half tail 109ta with a flat surface 109ts. The lower insulating layer 109 may include the surface 109s at a lower level and the surface 109ts at a higher level, thereby having a stepwise profile. As a result of the removing step, the lowermost surface 120pt of the lowermost portion 120p of the through electrode 120 may be coplanar with the surface 109ts of the half tail 109ta.

Referring to FIG. 5C, the lower terminal 118 may be formed on the lower insulating layer 109 in such a way that the lower terminal 118 may be coupled to the lowermost portion 120p of the through electrode 120, and then the supporting plate 70 may be removed. As the result of a above described process steps, the semiconductor device 1 of FIG. 1 may be fabricated to include an electric connecting portion 11a, in which the through electrode 120 may be supported by the half tail 109ta.

Referring to FIG. 5D, a planarization process may be performed in such a way that the surface 109s of the lower insulating layer 109 may become substantially coplanar with the lowermost surface 120pt of the through electrode 120. In the present embodiments, an electric connecting portion 11ab may be configured not to have the half tail 109ta of FIG. 5C. For example, the electric connecting portion 11ab may have substantially the same or similar structure as the electric connecting portion 11 of FIG. 4H.

Fabrication Method

A Further Example Embodiment

Figure 6A:
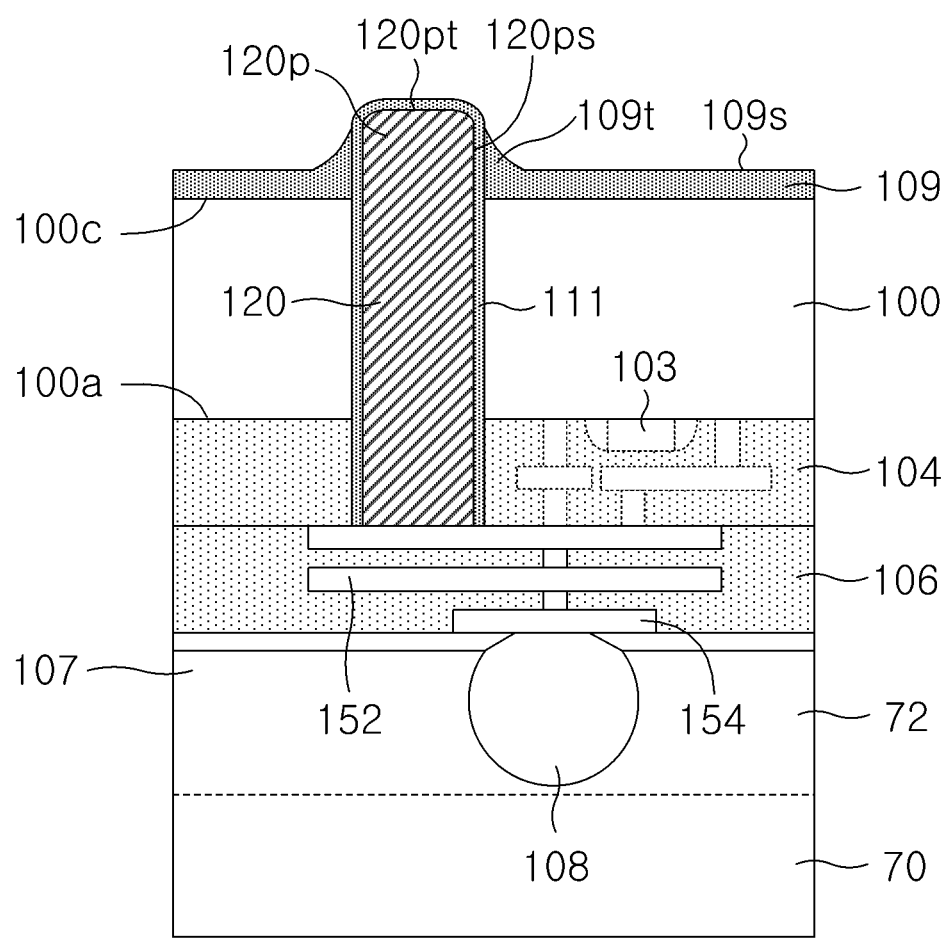
FIGS. 6A through 6C are sectional views exemplarily illustrating a method of fabricating a semiconductor device according to another example embodiment of the inventive concepts.
Figure 6B:
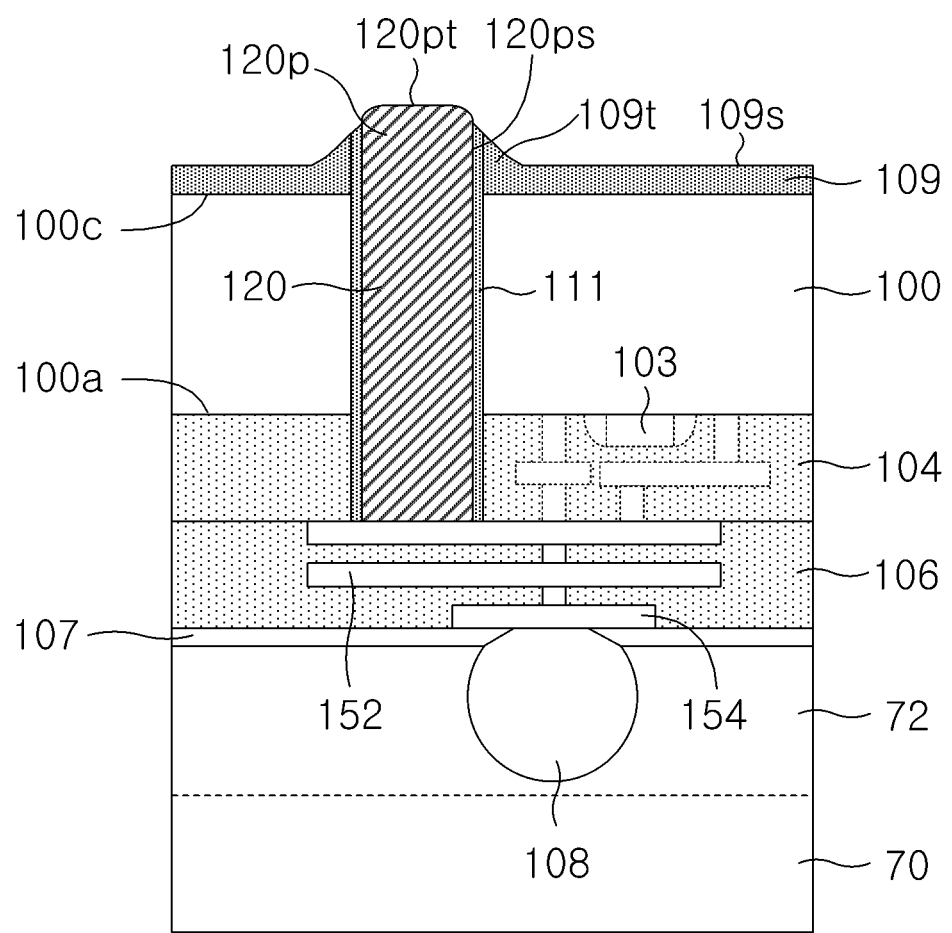
Figure 6C:
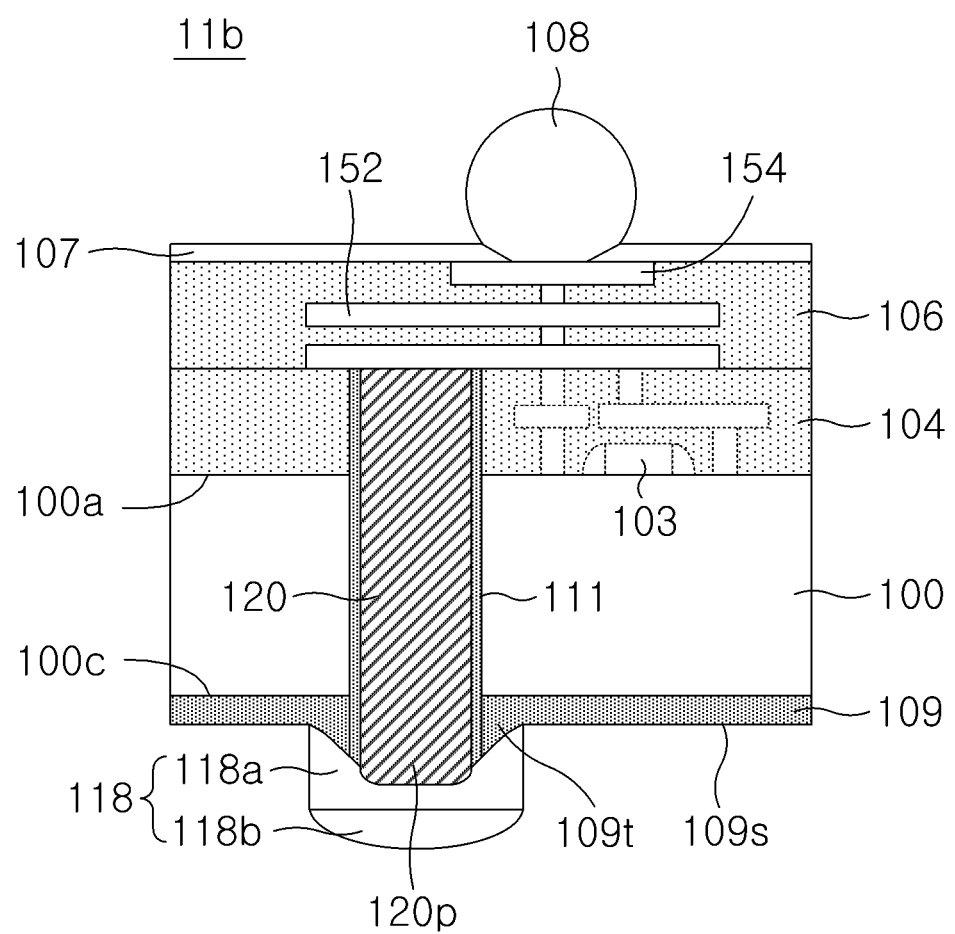
Figure 6D:
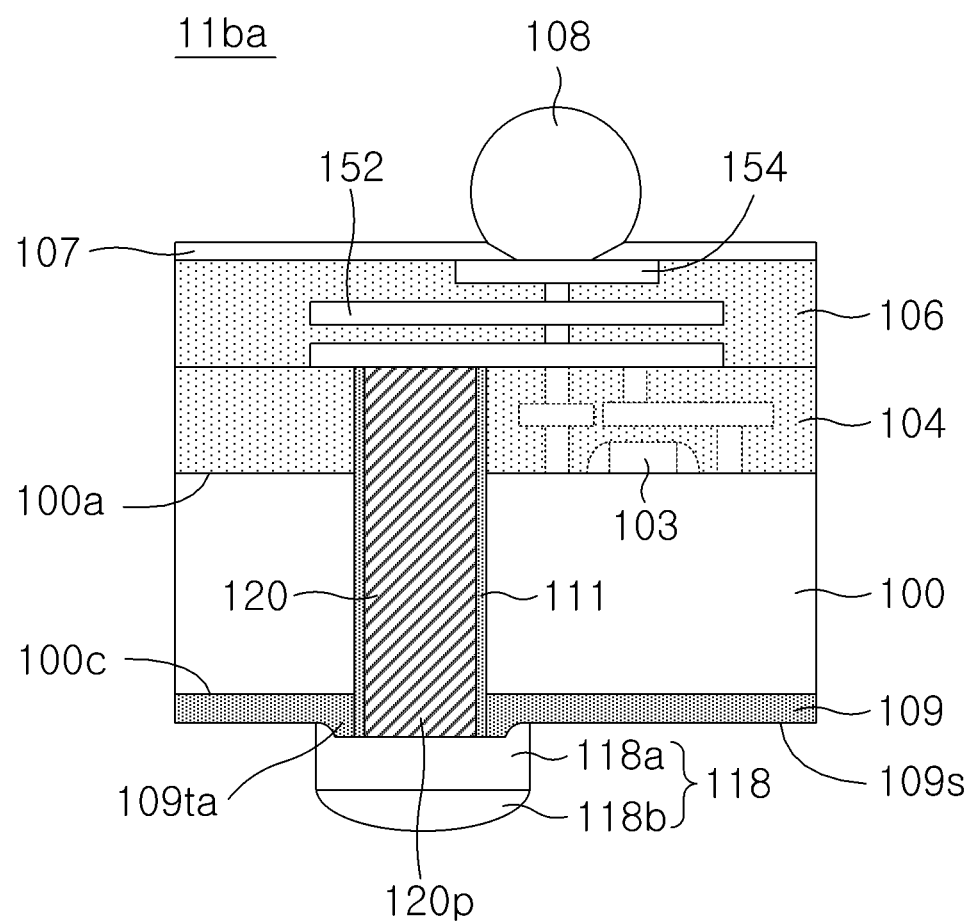
FIGS. 6D and 6E are sectional views illustrating modified examples of FIG. 6C.
Figure 6E:
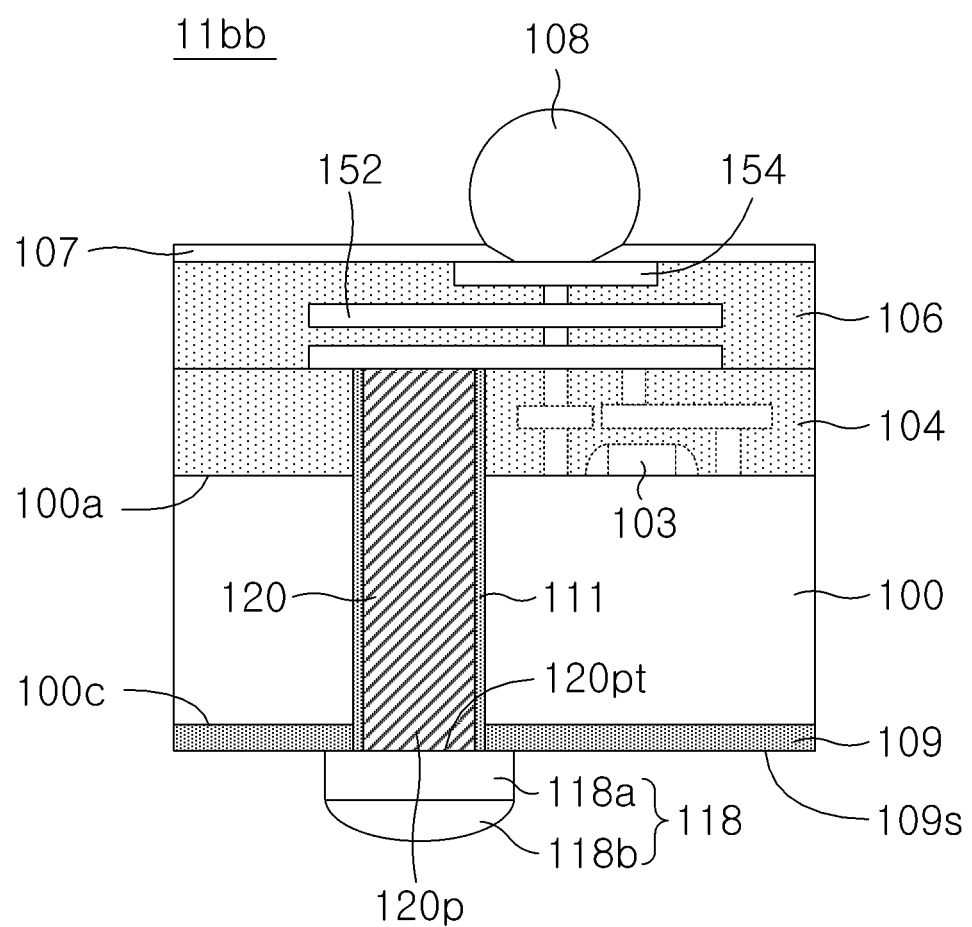

FIGS. 6A through 6C are sectional views illustrating a method of fabricating a semiconductor device according to another example embodiment of the inventive concepts. FIGS. 6D and 6E are sectional views illustrating modified examples of FIG. 6C.

Referring to FIG. 6A, similar or identical to the previous embodiments described with reference to FIG. 5A, the integrated circuit 103, the through electrode 120, and the metal line 152 may be formed. Thereafter, the substrate 100 may be removed to protrude the through electrode 120 outward from the second bottom surface 100c. The lower insulating layer 109 may be formed on the second bottom surface 100c of the substrate 100 using the FCVD process. The lower insulating layer 109 may include the tail 109t extending from the surface 109s and surrounding the lowermost portion 120p and side surface 120ps of the through electrode 120. The tail 109t may be formed to have a conical shape whose width decreases toward the lowermost surface 120pt of the through electrode 120.

Referring to FIG. 6B, an etching process may be performed using an etchant capable of selectively etching the via insulating layer 111. In example embodiments, the via insulating layer 111 may be selectively removed from the lowermost surface 120pt of the lowermost portion 120p of the through electrode 120, thereby exposing the lowermost surface 120pt of the lowermost portion 120p of the through electrode 120. The exposure of the through electrode 120 may be performed using the etching process, in which a CMP process is not included. As a result, it may be possible to suppress or prevent various technical problems (for example, warpage or breakage of the through electrode 120 and/or occurrence pollution or particles), which may result from the CMP process. Since the tail 109t supports the side surface 120ps of the lowermost portion 120p of the through electrode 120, it can contribute to improved mechanical endurance of the through electrode 120. In example embodiments, the lowermost surface 120pt of the lowermost portion 120p of the through electrode 120 may be protruded with respect to the tail 109t.

Referring to FIG. 6C, the lower terminal 118 may be formed on the lower insulating layer 109 in such a way that it may be coupled to the lowermost portion 120p of the through electrode 120, and then the supporting plate 70 may be removed. The lower terminal 118 may be provided in a form of the metal bump 118a coupled to the lowermost portion 120p of the through electrode 120. The lower terminal 118 may further include the solder 118b, which may be provided on the metal bump 118a to improve adhesion strength of the metal bump 118a. In other embodiments, the lower terminal 118 may be formed to have the pad shape as shown in FIG. 5C. As the result of the above described process steps, the semiconductor device 1 of FIG. 1 may be fabricated to include an electric connecting portion 11b, in which the through electrode 120 may be supported by the tail 109t.

Referring to FIG. 6D, the lower insulating layer 109 may be formed on the second bottom surface 100c of the substrate 100 using the FCVD process, and then, be planarized. In the present embodiments, an electric connecting portion 11ba may be formed to include the half tail 109ta protruding from the surface 109s of the lower insulating layer 109. Alternatively, referring to FIG. 6E, the lower insulating layer 109 may be formed on the second bottom surface 100c of the substrate 100 using the FCVD process, and then, be planarized in such a way that the surface 109s of the lower insulating layer 109 may become substantially coplanar with the lowermost surface 120pt of the through electrode 120. Accordingly, an electric connecting portion 11bb may be formed without the half tail 109ta of FIG. 6D.

Fabrication Method

Another Example Embodiment

Figure 7A:
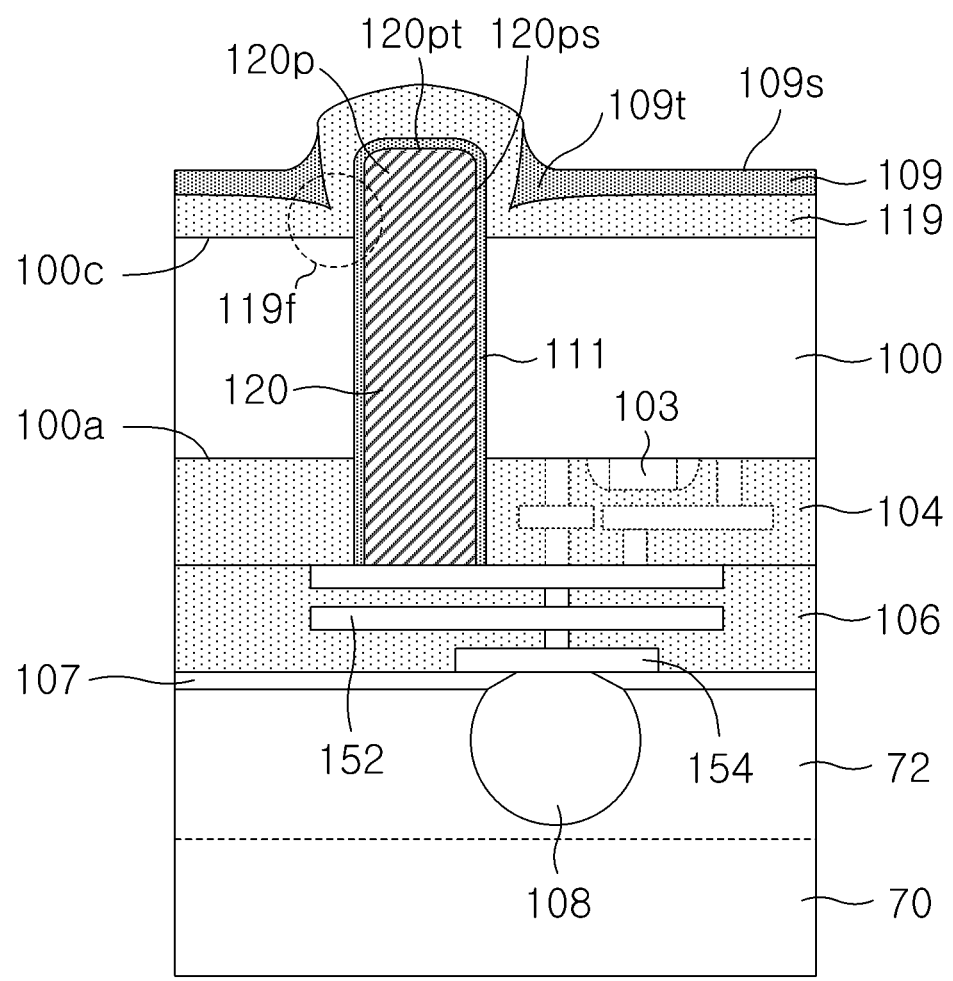
FIGS. 7A through 7D are sectional views exemplarily illustrating a method of fabricating a semiconductor device according to another example embodiment of the inventive concepts.
Figure 7B:
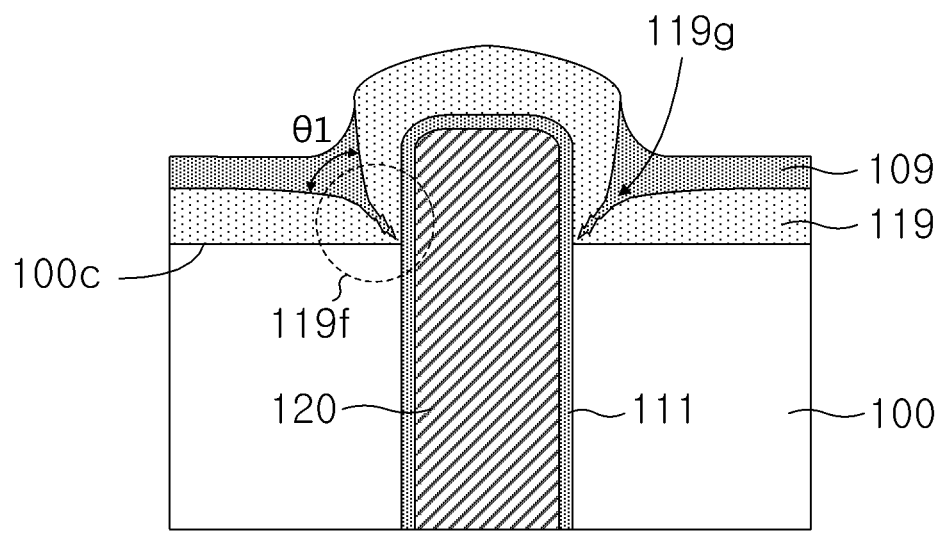
Figure 7C:
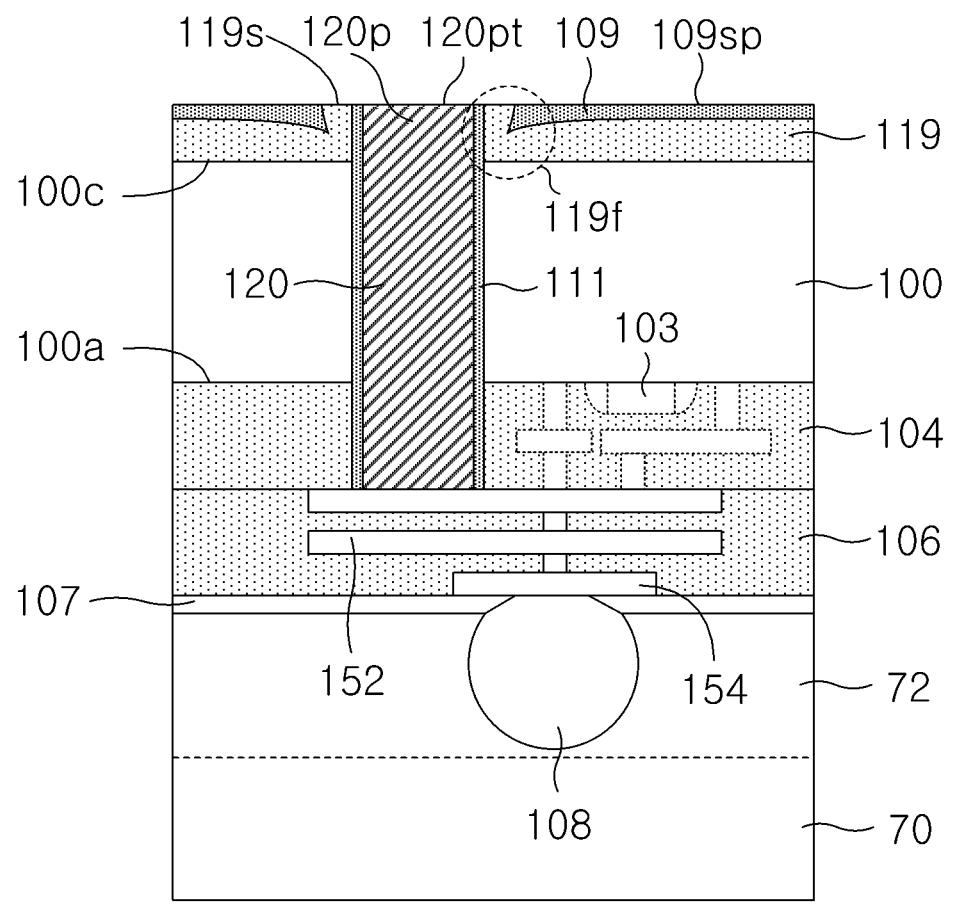
Figure 7D:
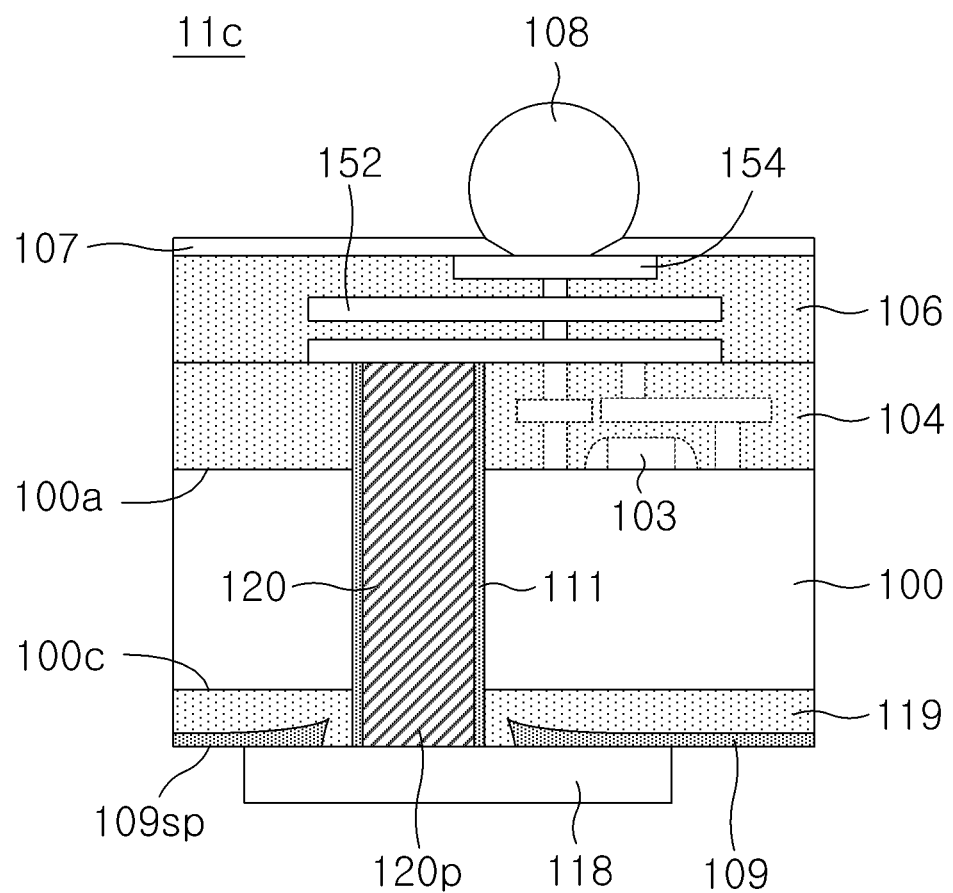

FIGS. 7A through 7D are sectional views exemplarily illustrating a method of fabricating a semiconductor device according to another example embodiment of the inventive concepts. FIG. 7B is an enlarged sectional view illustrating a portion of FIG. 7A.

Referring to FIG. 7A, similar or identical to the previous embodiments described with reference to FIG. 5A, the integrated circuit 103, the through electrode 120, and the metal line 152 may be formed. Thereafter, the substrate 100 may be removed to protrude the through electrode 120 outward from the second bottom surface 100c. The lower insulating layer 109 may be the FCVD layer formed on the second bottom surface 100c of the substrate 100. According to the process condition of the FCVD process, the lower insulating layer 109 may be formed to include the tail 109t supporting the side surface 120ps of the lowermost portion 120p of the through electrode 120. In other embodiments, the lower insulating layer 109 may be formed not to include the tail 109t.

Before the formation of the lower insulating layer 109, a second lower insulating layer 119 may be formed on the second bottom surface 100c of the substrate 100. The second lower insulating layer 119 may be formed as a conventional CVD layer. The second lower insulating layer 119 may be formed to cover the lowermost and side surfaces 120pt and 120ps of the lowermost portion 120p of the through electrode 120. On the side surface 120ps of the lowermost portion 120p, the second lower insulating layer 119 may be formed to have a thickness which gradually decreases from the lowermost surface 120pt of the lowermost portion 120p toward the second bottom surface 100c of the substrate 100. On the second bottom surface 100c of the substrate 100, the second lower insulating layer 119 may be formed to have a thickness which gradually increases outward from the through electrode 120. In other words, at an interfacial region between the second bottom surface 100c of the substrate 100 and the through electrode 120, the second lower insulating layer 119 may include a folded portion 119f having a relatively thin thickness. In example embodiments, the surface 109s of the lower insulating layer 109 may not be flat. Furthermore, at least one insulating layer (e.g., of the conventional CVD layer) may be formed between the lower insulating layer 109 and the second lower insulating layer 119.

Referring to FIG. 7B, the folded portion 119f may be formed to have a folding angle θ1 of 90° or less. The insulating material may not be normally deposited at the folded portion 119f, thereby forming a gap 119g. In this case, due to the presence of the gap 119g, the through electrode 120 may not be effectively supported by the second lower insulating layer 119 when the through electrode 120 is planarized by a subsequent polishing process. For example, the through electrode 120 may be warped or broken during the subsequent planarization process owing to the presence of the folded portion 119f of the second lower insulating layer 119 or the poor step coverage of the second lower insulating layer 119. By contrast, according to at least one example embodiment, the lower insulating layer 109 formed as an FCVD layer may be provided on the second lower insulating layer 119 to overcome technical issues caused by the poor step coverage of the second lower insulating layer 119 and fill the gap 119g, thereby allowing the second lower insulating layer 119 to support the through electrode 120 robustly.

Referring to FIG. 7C, the second bottom surface 100c of the substrate 100 may be planarized, for example, using a CMP process. As described above, the lower insulating layer 109 and the second lower insulating layer 119 may contribute to suppressing the through electrode 120 from being warped or broken during the polishing process. The lowermost portion 120p of the through electrode 120 may be removed and exposed. The lower insulating layer 109 may cover the folded portion 119f of the second lower insulating layer 119, and a planarized surface 109sp may be coplanar with the lowermost surface 120pt of the lowermost portion 120p of the through electrode 120. The second lower insulating layer 119 may be formed to have a planarized surface 119s coplanar with the planarized surface 109sp of the lower insulating layer 109. As described with reference to FIG. 7B, in the case in which the gap 119g is formed at the folded portion 119f of the second lower insulating layer 119, the lower insulating layer 109 may fill the gap 119g.

Referring to FIG. 7D, the lower terminal 118 may be formed to be coupled to the lowermost portion 120p of the through electrode 120, and then the supporting plate 70 may be removed. As a result of the above described process steps, the semiconductor device 1 of FIG. 1 may be fabricated to include an electric connecting portion 11c, in which the lower insulating layer 109 may be buried in the second lower insulating layer 119 to form a planarized insulation structure.

Fabrication Method

Yet Another Example Embodiment

Figure 8A:
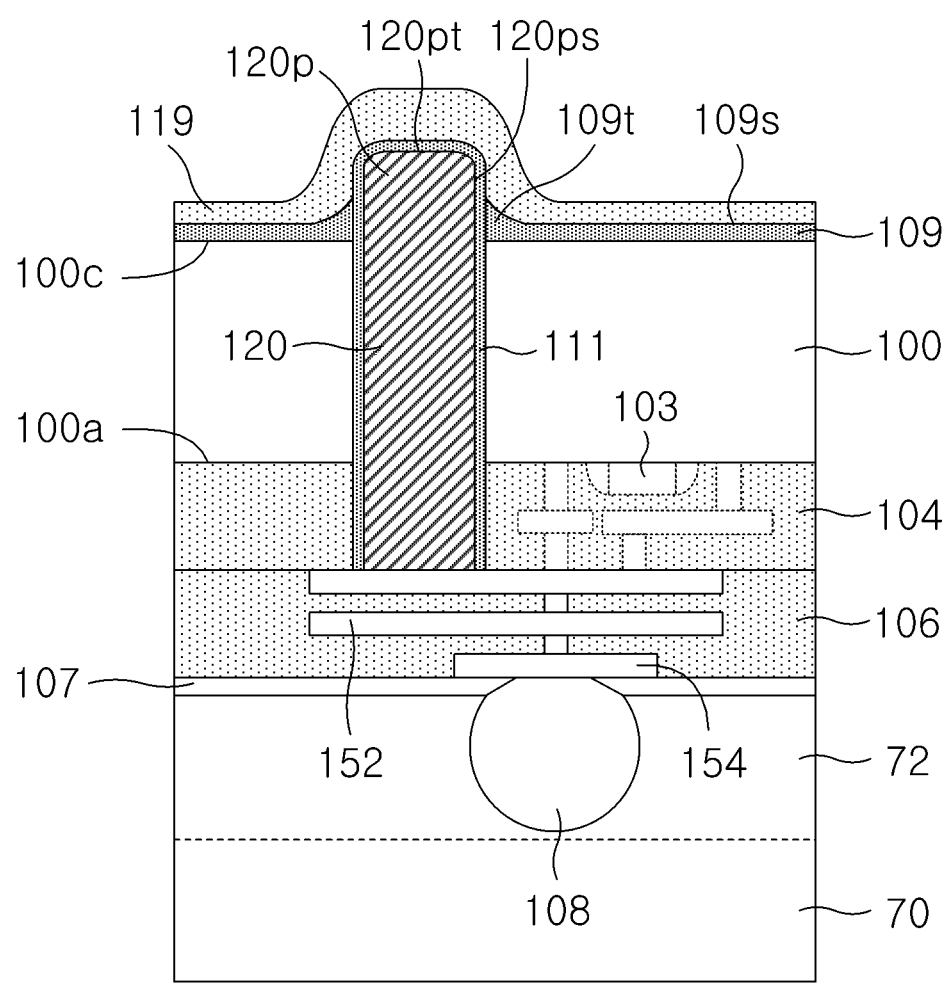
FIGS. 8A through 8D are sectional views exemplarily illustrating a method of fabricating a semiconductor device according to another example embodiment of the inventive concepts.
Figure 8B:
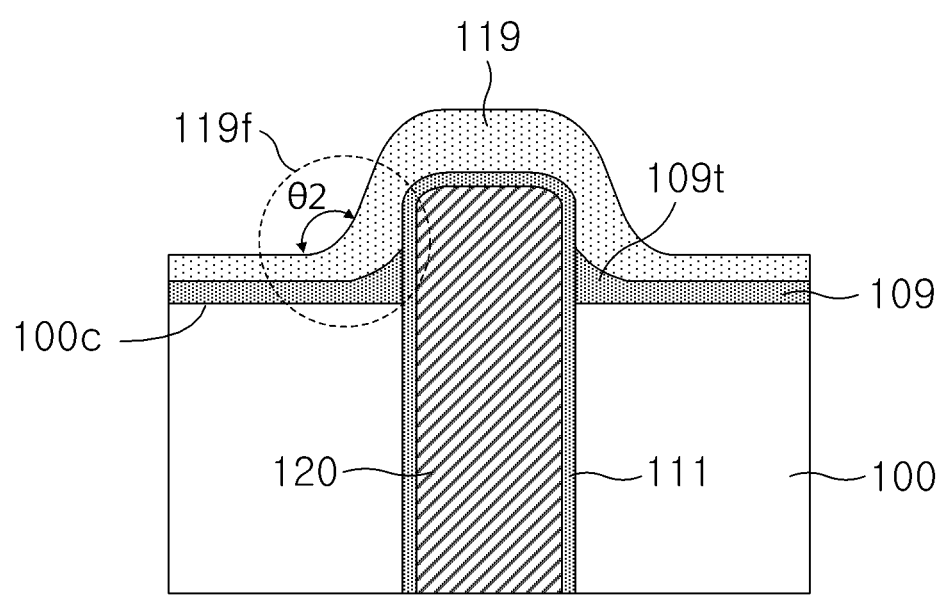
Figure 8C:
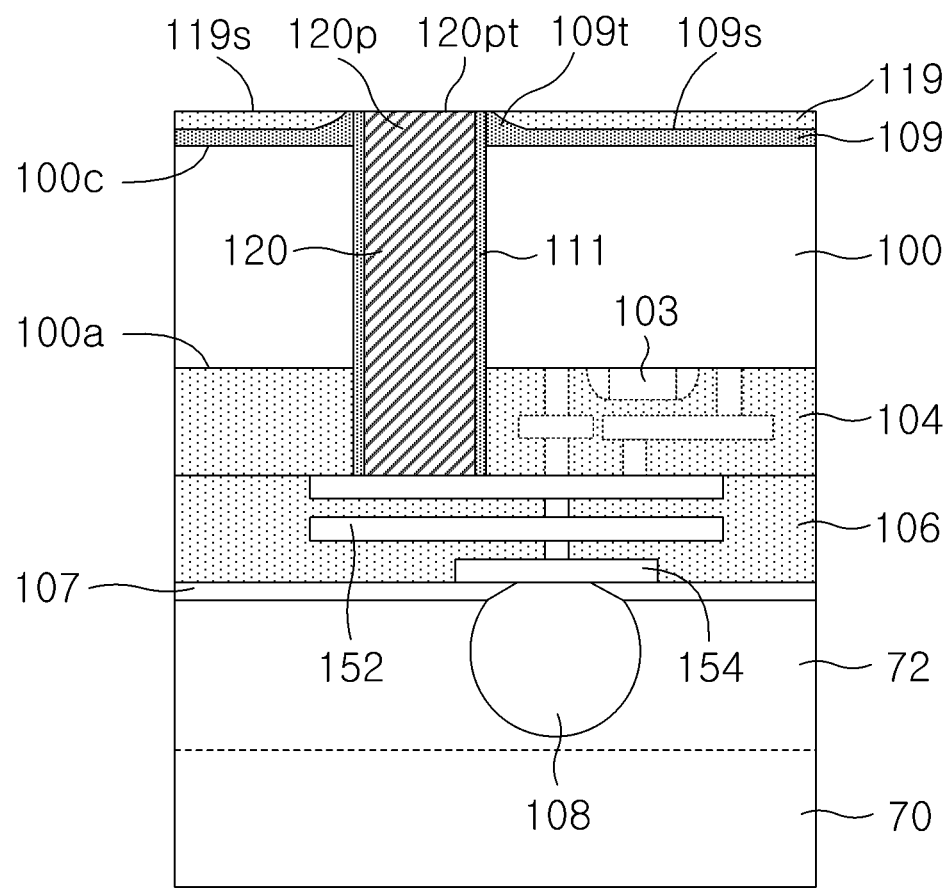
Figure 8D:
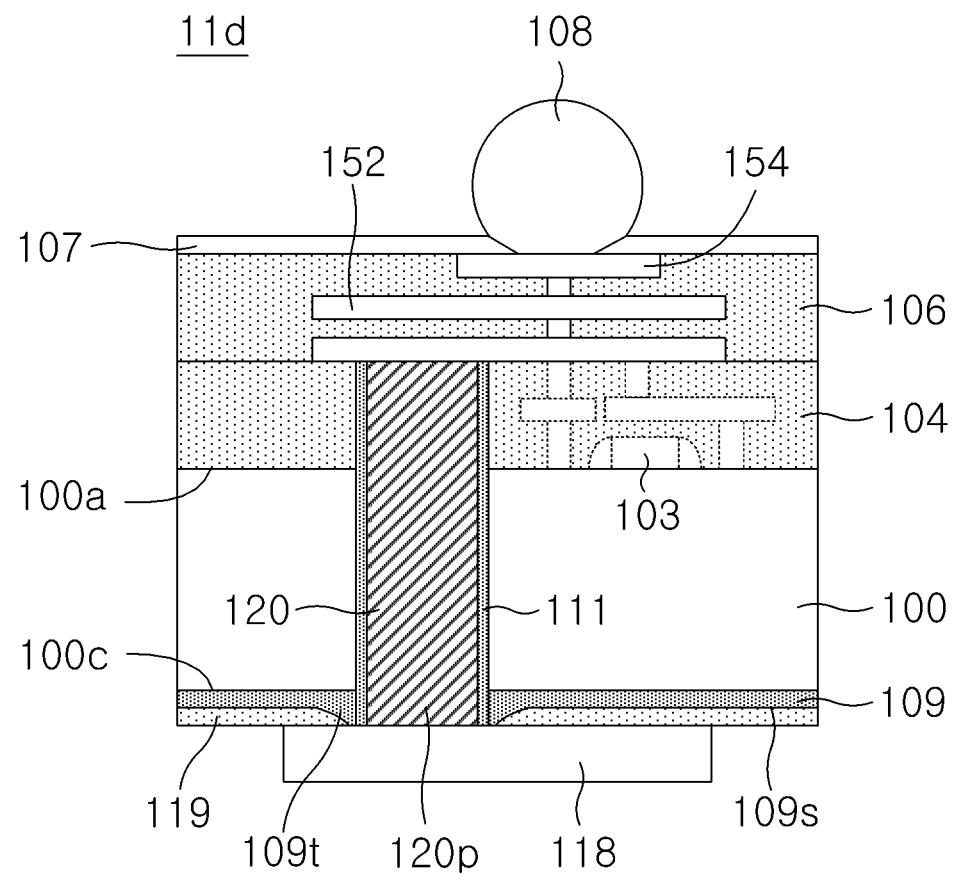

FIGS. 8A through 8D are sectional views exemplarily illustrating a method of fabricating a semiconductor device according to yet another example embodiment of the inventive concepts. FIG. 8B is an enlarged sectional view illustrating a portion of FIG. 8A on of FIG. 8A.

Referring to FIG. 8A, similar or identical to the previous embodiments described with reference to FIG. 5A, the integrated circuit 103, the through electrode 120, and the metal line 152 may be formed. Thereafter, the substrate 100 may be removed to protrude the through electrode 120 outward from the second bottom surface 100c. The lower insulating layer 109 of the FCVD layer may be formed on the second bottom surface 100c of the substrate 100, and the second lower insulating layer 119 of the conventional CVD layer may be formed on the lower insulating layer 109. The lower insulating layer 109 may extend from the surface 109s so as to include the tail 109t supporting the side surface 120ps of the lowermost portion 120p of the through electrode 120. Since the second lower insulating layer 119 is formed on the lower insulating layer 109 provided with the tail 109t, the folded portion 119f of the second lower insulating layer 119 may be formed to have a gentle slope. At least one insulating layer (e.g., of the conventional CVD layer) may be additionally formed between the lower insulating layer 109 and the second lower insulating layer 119.

Referring to FIG. 8B, the folded portion 119f may be formed to have a folding angle θ2 of about 90° or more. As a result of the increased folding angle, a process of depositing an insulating layer at the folded portion 119f can be smoothly performed, for example, without the occurrence of gap; that is, it may be possible to prevent a process failure from occurring during the formation of the second lower insulating layer 119.

Referring to FIG. 8C, a planarization process may be performed on the second bottom surface 100c of the substrate 100, for example, using a CMP process. As described above, the lower insulating layer 109 and the second lower insulating layer 119 may contribute to suppressing the through electrode 120 from being warped or broken during the planarization process. The lowermost portion 120p of the through electrode 120 may be removed and exposed. The second lower insulating layer 119 may be formed to cover the lower insulating layer 109, and the surface 119s may be coplanar with the lowermost surface 120pt of the lowermost portion 120p of the through electrode 120.

Referring to FIG. 8D, the lower terminal 118 may be formed to be coupled to the lowermost portion 120p of the through electrode 120, and the supporting plate 70 may be removed. As a result of the above described process steps, the semiconductor device 1 of FIG. 1 may be fabricated to include an electric connecting portion 11d, in which the second lower insulating layer 119 may be stacked on the lower insulating layer 109 to form a planarized insulation structure.

Fabrication Method

Another Example Embodiment

Figure 9A:
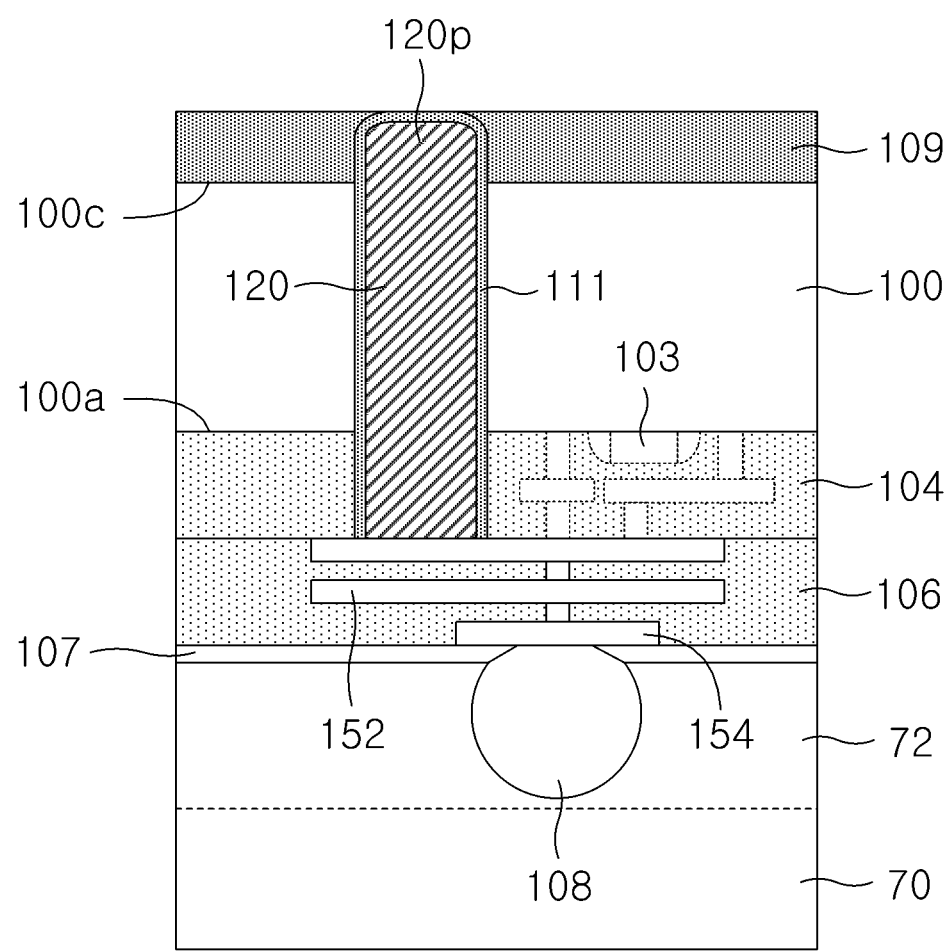
FIGS. 9A through 9C are sectional views exemplarily illustrating a method of fabricating a semiconductor device according to another example embodiment of the inventive concepts.
Figure 9B:
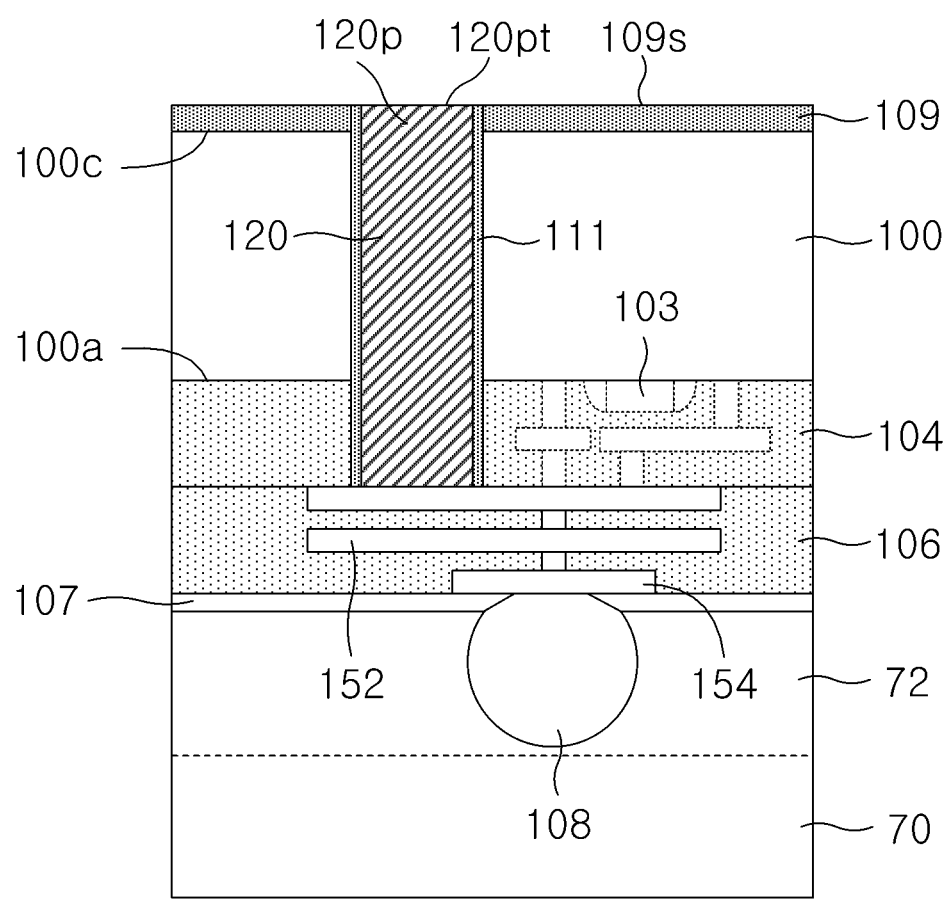
Figure 9C:
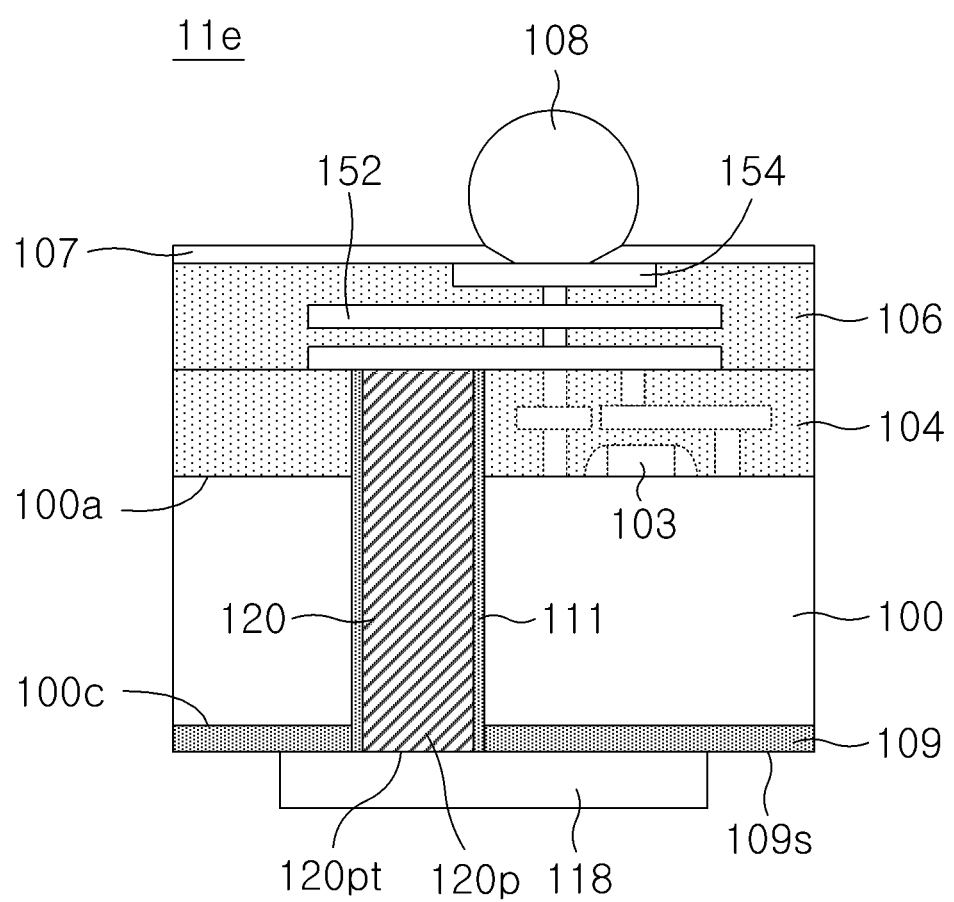

FIGS. 9A through 9C are sectional views exemplarily illustrating a method of fabricating a semiconductor device according to another example embodiment of the inventive concepts.

Referring to FIG. 9A, similar or identical to the previous embodiments described with reference to FIG. 5A, the integrated circuit 103, the through electrode 120, and the metal line 152 may be formed. Thereafter, the substrate 100 may be removed to protrude the through electrode 120 outward from the second bottom surface 100c. The lower insulating layer 109 of the FCVD layer may be formed on the second bottom surface 100c of the substrate 100. The lower insulating layer 109 may be formed to have a thickness capable of covering the lowermost portion 120p of the through electrode 120 protruding outward from the second bottom surface 100c of the substrate 100. In example embodiments, the lower insulating layer 109 may cover completely the lowermost portion 120p of the through electrode 120. The via insulating layer 111 may be covered with or be partially exposed by the lower insulating layer 109.

Referring to FIG. 9B, the second bottom surface 100c of the substrate 100 may be planarized by a chemical-mechanical polishing process, an etch-back process, or a wet etching process. As the result of the planarization process, the lowermost portion 120p of the through electrode 120 may be exposed. In example embodiments, the lowermost portion 120p of the through electrode 120 may be recessed during the planarization process. The lower insulating layer 109 may have a structure horizontally extending along the second bottom surface 100c of the substrate 100. For example, the lowermost surface 120pt of the through electrode 120 may be coplanar with the surface 109s of the lower insulating layer 109.

Referring to FIG. 9C, the lower terminal 118 may be formed on the lower insulating layer 109 in such a way that it may be coupled to the lowermost portion 120p of the through electrode 120, and then the supporting plate 70 may be removed. As a result of the above described process steps, the semiconductor device 1 of FIG. 1 may be fabricated to include an electric connecting portion 11e. In the present embodiments, the electric connecting portion 11e may be configured to have substantially the same or similar structure as the electric connecting portion 11 of FIG. 4H.

Fabrication Method

Another Example Embodiment

Figure 10A:
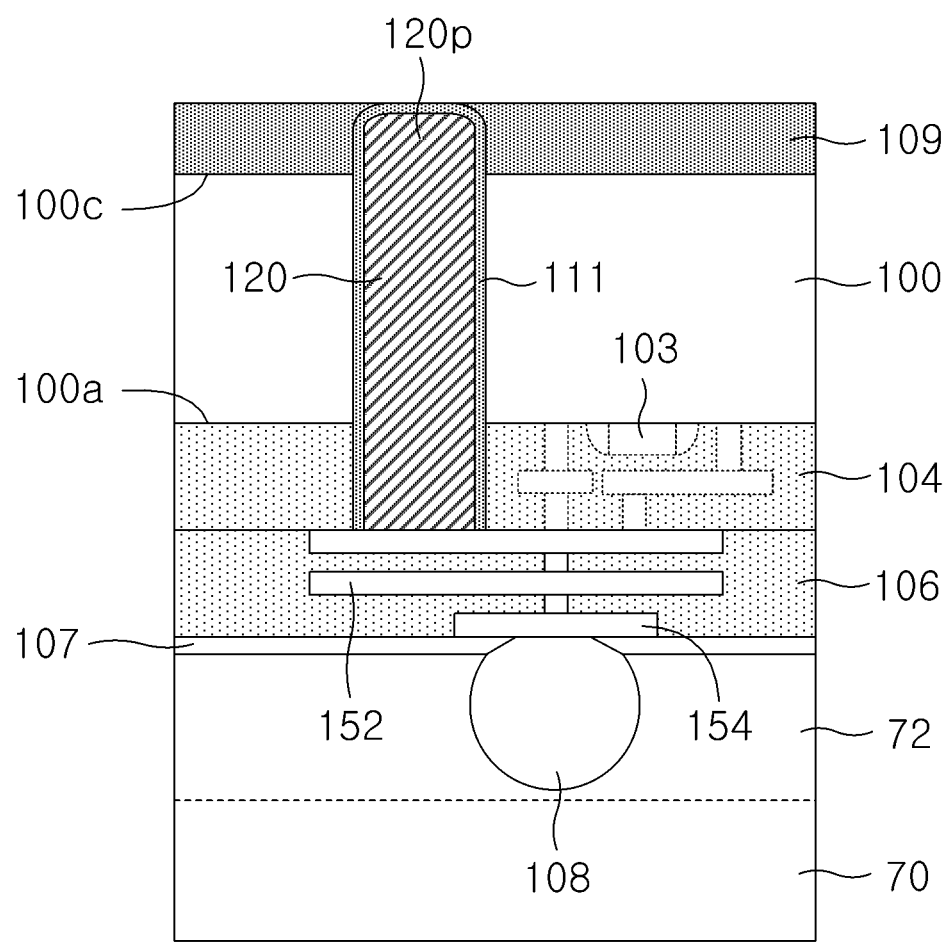
FIGS. 10A through 10C are sectional views exemplarily illustrating a method of fabricating a semiconductor device according to another example embodiment of the inventive concepts.
Figure 10B:
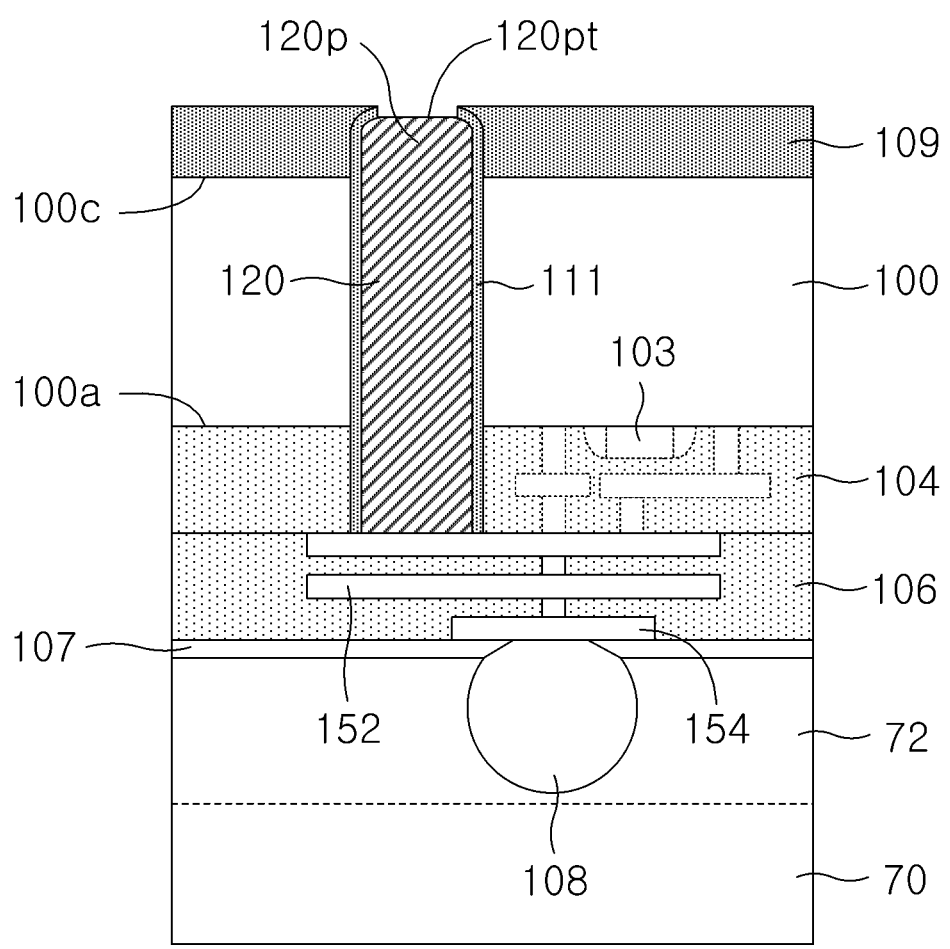
Figure 10C:
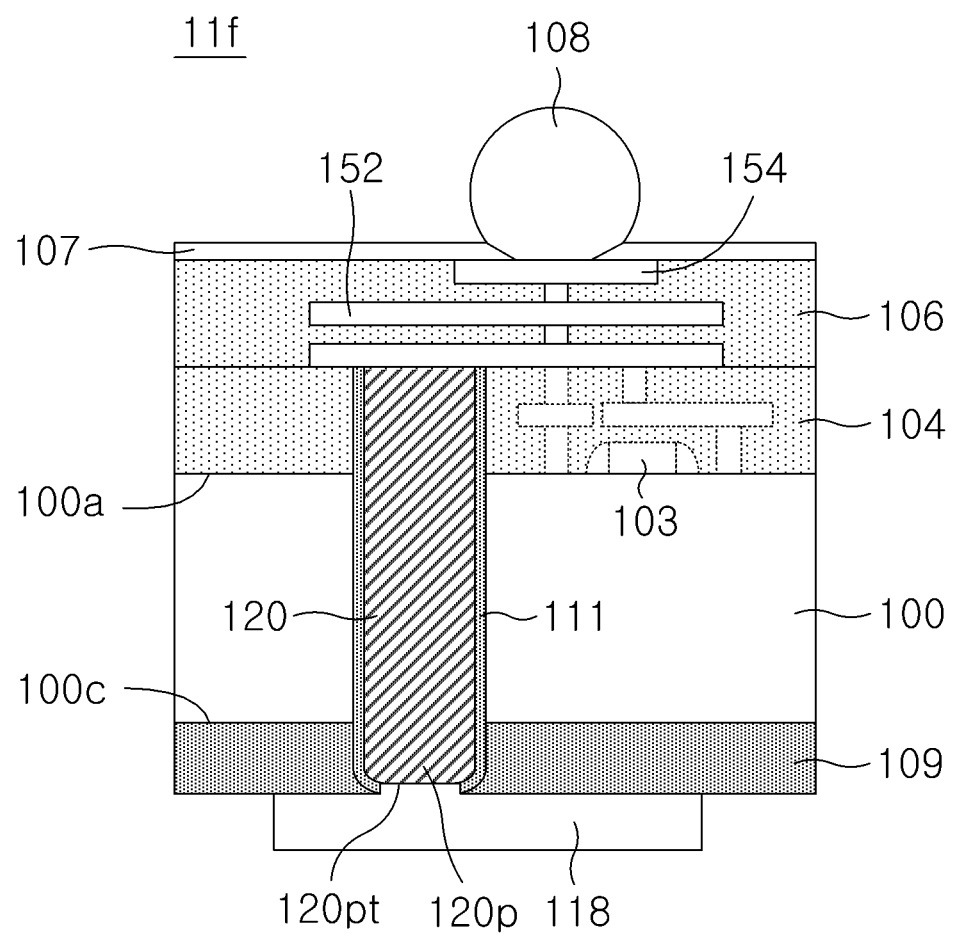

FIGS. 10A through 10C are sectional views exemplarily illustrating a method of fabricating a semiconductor device according to another example embodiment of the inventive concepts.

Referring to FIG. 10A, similar or identical to the previous embodiments described with reference to FIG. 5A, the integrated circuit 103, the through electrode 120 and the metal line 152 may be formed, and thereafter, the substrate 100 may be recessed in such a way that the through electrode 120 may protrude outward from the second bottom surface 100c. The lower insulating layer 109 of the FCVD layer may be formed on the second bottom surface 100c of the substrate 100. The lower insulating layer 109 may be formed to have a thickness capable of covering the lowermost portion 120p of the through electrode 120 protruding outward from the second bottom surface 100c of the substrate 100 but exposing the via insulating layer 111.

Referring to FIG. 10B, the lowermost surface 120pt of the through electrode 120 may be exposed. In example embodiments, the via insulating layer 111 may be a conventional CVD layer and the lower insulating layer 109 may be a FCVD layer, and in this case, the via insulating layer 111 and the lower insulating layer 109 may have different etch rates from each other. For example, as described with reference to FIG. 4F, in a wet etching process using an HF-containing etchant (e.g., 200:1 diluted HF solution), the conventional CVD layer (e.g., TEOS) may have an etch rate of about 80 Å/min and the FCVD layer may have an etch rate of about 130 Å/min. This difference in etch rate may be used to selectively remove a portion of the via insulating layer 111 exposed through the lower insulating layer 109. The lowermost surface 120pt of the through electrode 120 may be exposed as the result of the selective removal of the via insulating layer 111.

Referring to FIG. 10C, the lower terminal 118 may be formed on the lower insulating layer 109 in such a way that it may be connected to the lowermost portion 120p of the through electrode 120, and then, the supporting plate 70 may be removed. As a result of the above described process steps, the semiconductor device 1 of FIG. 1 may be fabricated to include an electric connecting portion 11f.

Fabrication Method

Another Example Embodiment

Figure 11A:
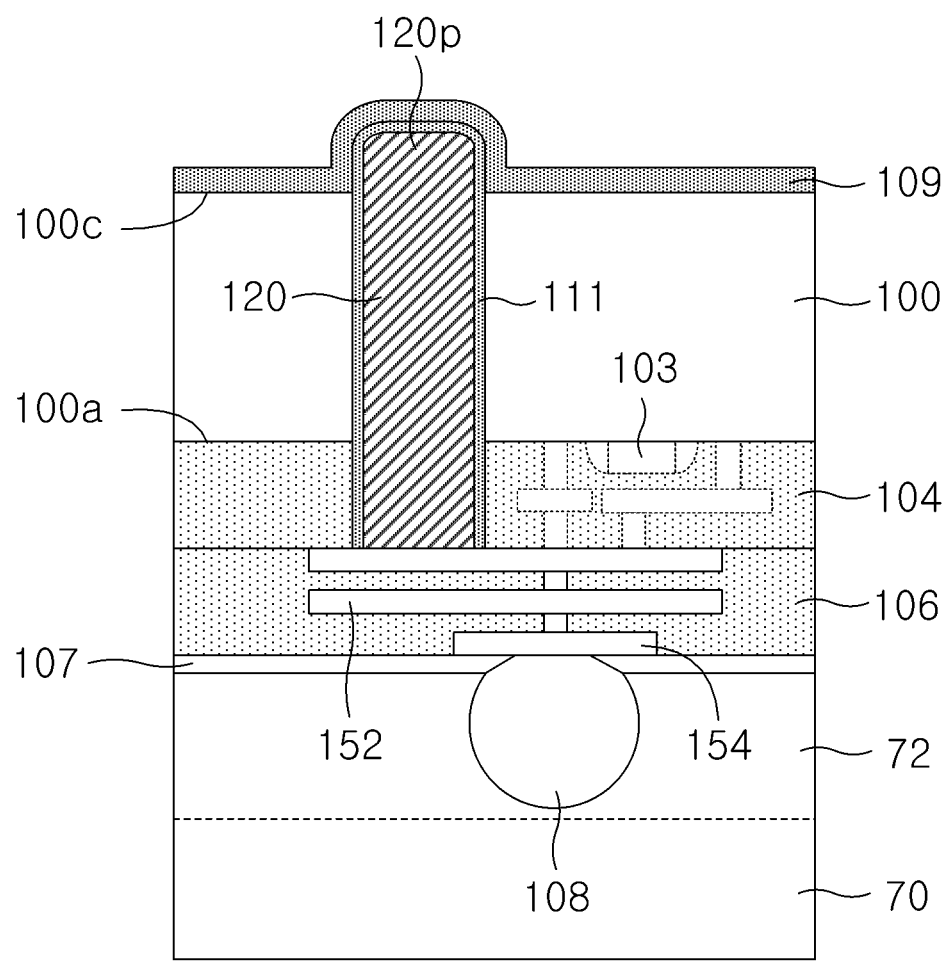
FIGS. 11A through 11C are sectional views exemplarily illustrating a method of fabricating a semiconductor device according to another example embodiment of the inventive concepts.
Figure 11B:
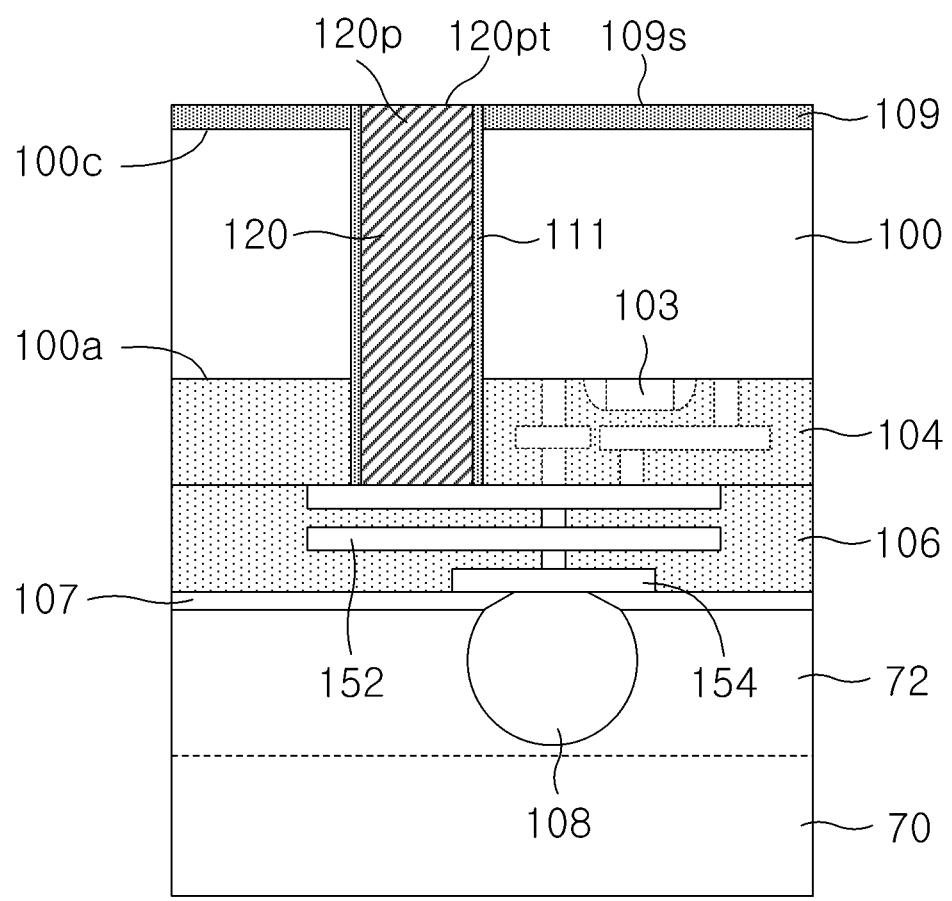
Figure 11C:
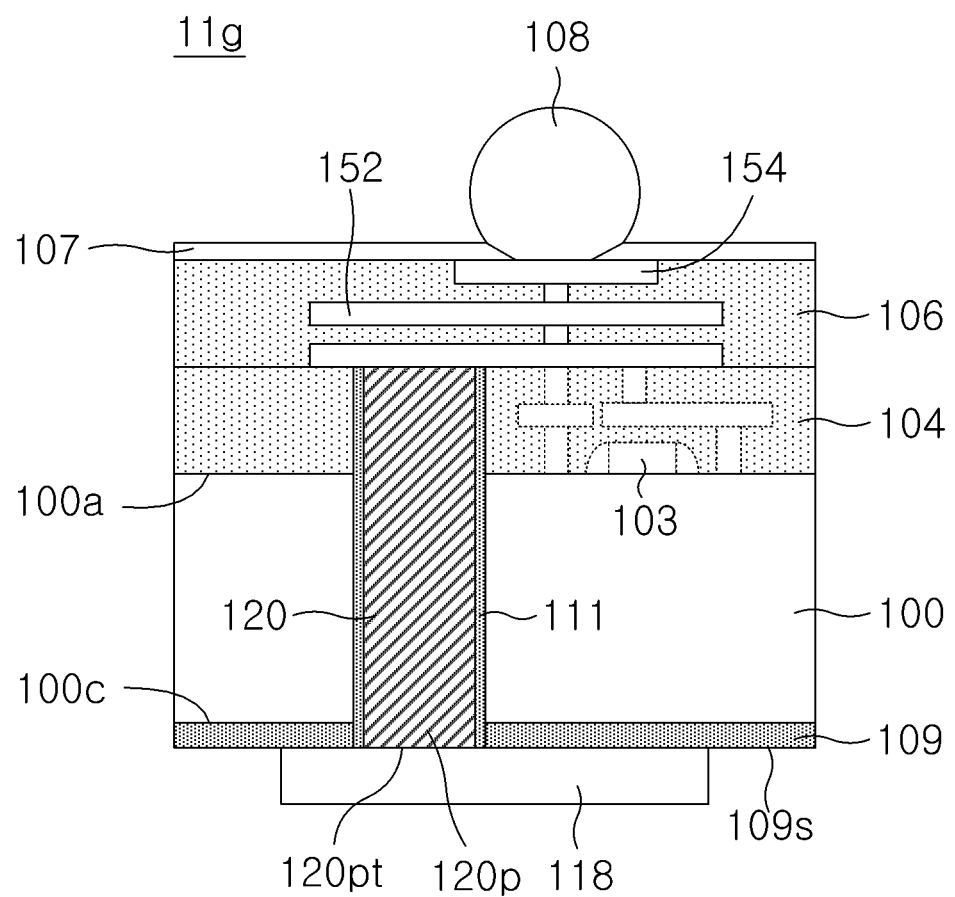
Figure 11D:
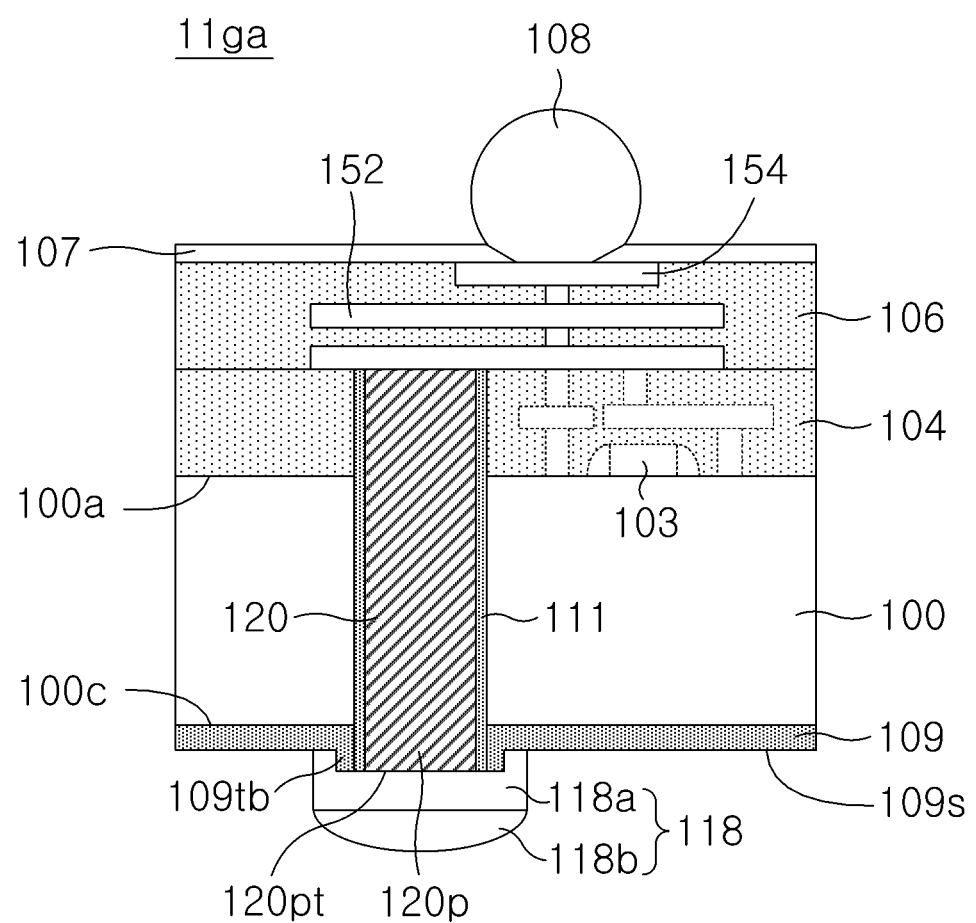
FIG. 11D is a sectional view illustrating a modified example of FIG. 11C.

FIGS. 11A through 11C are sectional views exemplarily illustrating a method of fabricating a semiconductor device according to another example embodiment of the inventive concepts. FIG. 11D is a sectional view illustrating a modified example of FIG. 11C.

Referring to FIG. 11A, similar or identical to the previous embodiments described with reference to FIG. 5A, the integrated circuit 103, the through electrode 120 and the metal line 152 may be formed, and then, the substrate 100 may be recessed in such a way that the through electrode 120 may protrude outward from the second bottom surface 100c. The lower insulating layer 109 of the FCVD layer may be formed on the second bottom surface 100c of the substrate 100. The lower insulating layer 109 may be conformally formed on the second bottom surface 100c of the substrate 100. For example, the lower insulating layer 109 may include a flat portion covering the second bottom surface 100c of the substrate 100 and a curved portion covering the lowermost portion 120p of the through electrode 120. Depending on a process condition, the lower insulating layer 109 may be formed to have a uniform or variable thickness. For example, the thickness of the lower insulating layer 109 may be greater on the second bottom surface 100c of the substrate 100 than on the lowermost portion 120p of the through electrode 120, or vice versa.

Referring to FIG. 11B, the second bottom surface 100c of the substrate 100 may be planarized. As the result of the planarization process, the lowermost portion 120p of the through electrode 120 may be recessed or be exposed by a partial removal of the via insulating layer 111. The lowermost surface 120pt of the through electrode 120 may be coplanar with the surface 109s of the lower insulating layer 109.

Referring to FIG. 11C, the lower terminal 118 may be formed on the lower insulating layer 109 in such a way that it may be connected to the lowermost portion 120p of the through electrode 120, and then, the supporting plate 70 may be removed. As a result of the above described process steps, the semiconductor device 1 of FIG. 1 may be fabricated to include an electric connecting portion 11g. In the present embodiments, the electric connecting portion 11g may be configured to have substantially the same or similar structure as the electric connecting portion 11 of FIG. 4H.

In other embodiments, as shown in FIG. 11D, after the formation of the lower insulating layer 109, a planarization process may be performed in such a way that the lowermost surface 120pt of the through electrode 120 may protrude from the surface 109s of the lower insulating layer 109. The lower insulating layer 109 may include a ring tail 109tb covering a side surface of the lowermost portion 120p of the through electrode 120. The lower terminal 118 may be formed on the lower insulating layer 109 in such a way that it may be connected to the lowermost portion 120p of the through electrode 120, and then, the supporting plate 70 may be removed. The lower terminal 118 may include the metal bump 118a coupled to the lowermost portion 120p of the through electrode 120 and the solder 118b provided on the metal bump 118a. In other embodiments, the lower terminal 118 may be formed to have the pad structure shown in FIG. 11C. As a result of the above described process steps, the semiconductor device 1 of FIG. 1 may be fabricated to include an electric connecting portion 11ga with the ring tail 109tb.

Fabrication Method

Another Example Embodiment

FIGS. 12A through 12D are sectional views exemplarily illustrating a method of fabricating a semiconductor device according to another example embodiment of the inventive concepts.

Figure 12A:
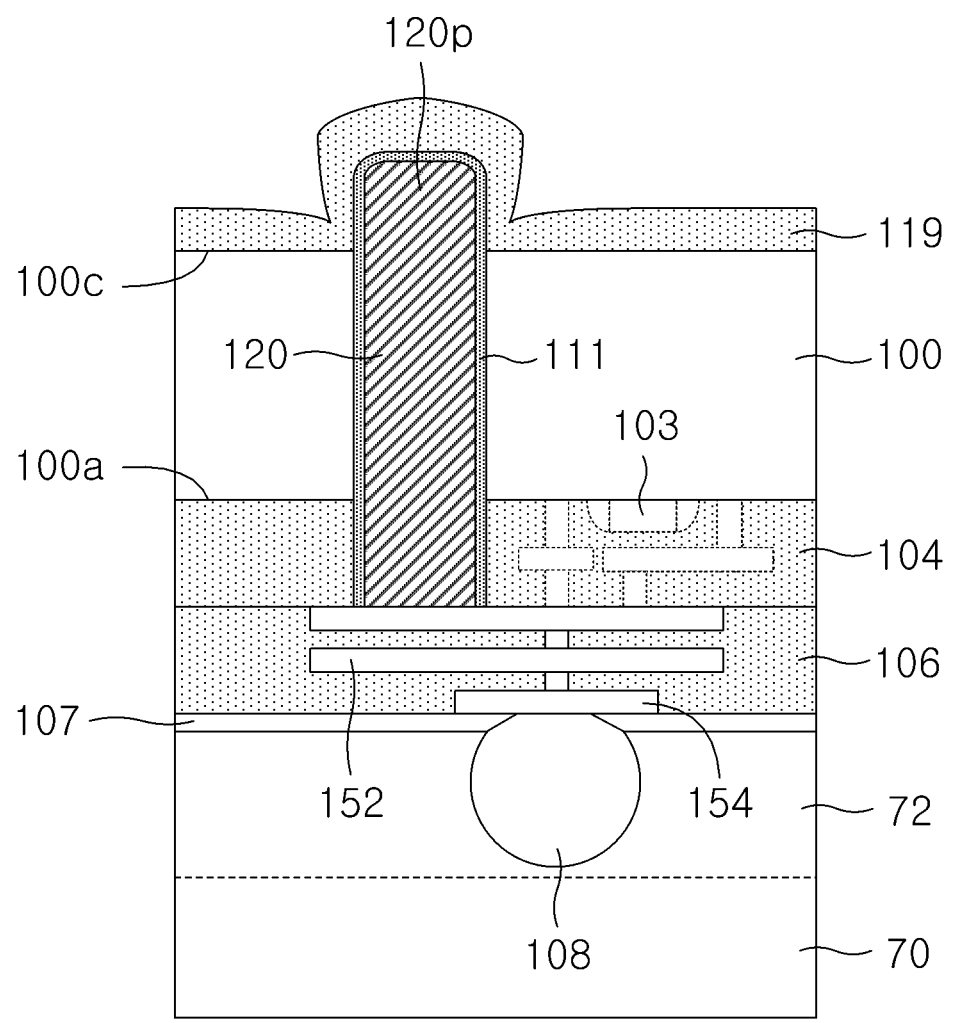
FIGS. 12A through 12D are sectional views exemplarily illustrating a method of fabricating a semiconductor device according to another example embodiment of the inventive concepts.

Referring to FIG. 12A, similar or identical to the previous embodiments described with reference to FIG. 7A, the integrated circuit 103, the through electrode 120 and the metal line 152 may be formed, and then, the substrate 100 may be recessed in such a way that the through electrode 120 may protrude outward from the second bottom surface 100c. The second lower insulating layer 119 may be formed on the second bottom surface 100c of the substrate 100 using a conventional CVD process. The second lower insulating layer 119 may be formed to cover the second bottom surface 100c of the substrate 100 and the lowermost portion 120p of the through electrode 120.

Figure 12B:
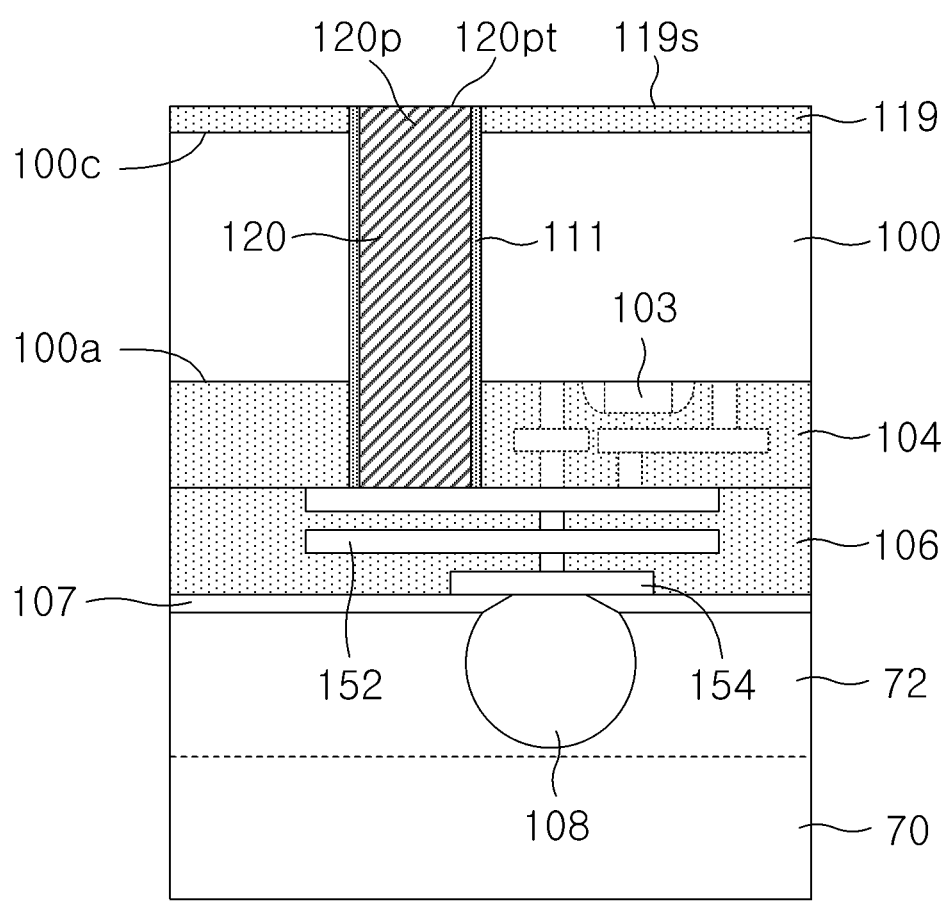

Referring to FIG. 12B, unlike that of FIG. 7A, the second lower insulating layer 119 may be planarized. As the result of the planarization process, the through electrode 120 may be recessed to expose the lowermost surface 120pt of the lowermost portion 120p. The lowermost surface 120pt of the through electrode 120 may be substantially coplanar with the surface 119s of the second lower insulating layer 119. In other embodiments, the planarization process may be performed in such a way that the lowermost surface 120pt of the through electrode 120 may protrude from the surface 119s of the lower insulating layer 119.

Figure 12C:
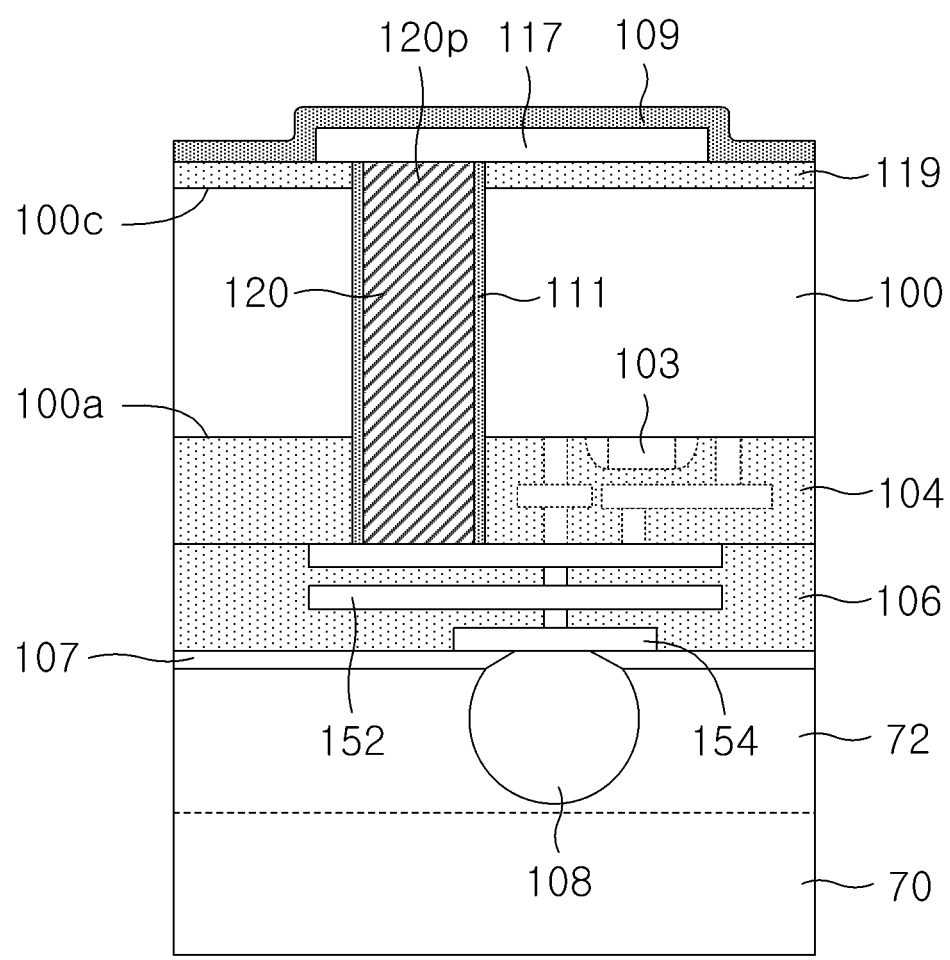

Referring to FIG. 12C, a re-distributed line 117 may be formed on the recessed second lower insulating layer 119 to be electrically connected to the through electrode 120, and then, the lower insulating layer 109 may be formed to cover the re-distributed line 117. The re-distributed line 117 may be formed by depositing and patterning a metal layer, and be formed to be in direct contact with the lowermost portion 120p of the through electrode 120. The lower insulating layer 109 may be formed using the FCVD process.

Figure 12D:
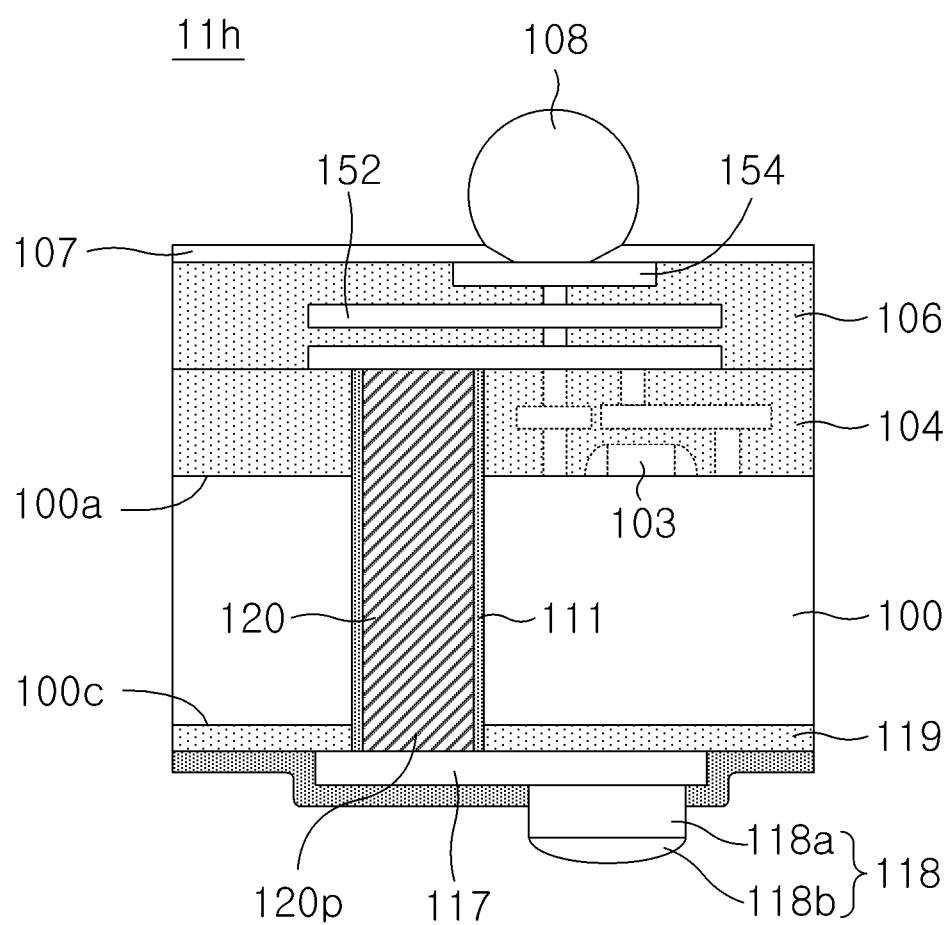

Referring to FIG. 12D, the lower terminal 118 may be formed in such a way that it may be connected to the re-distributed line 117, and then, the supporting plate 70 may be removed. The lower terminal 118 may include the metal bump 118a coupled to the re-distributed line 117 and the solder 118b provided on the metal bump 118a. In other embodiments, the lower terminal 118 may be formed to have the pad structure shown in FIG. 11C. As a result of the above described process steps, the semiconductor device 1 of FIG. 1 may be fabricated to include an electric connecting portion 11h.

Applications of Embodiments

Figure 13A:
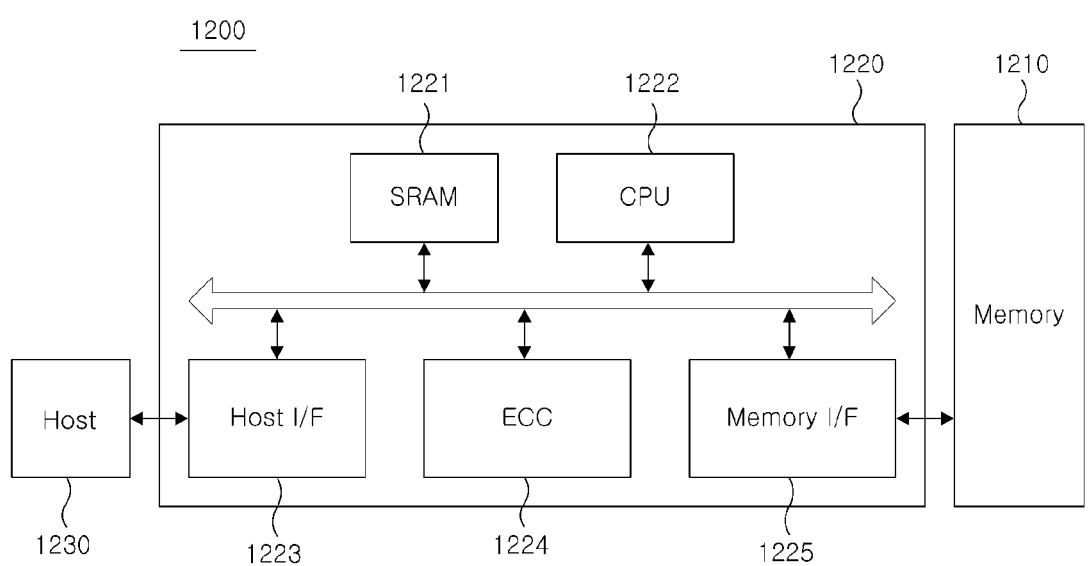
FIG. 13A is a block diagram of a memory card including a semiconductor device according to an example embodiment of the inventive concepts.
Figure 13B:
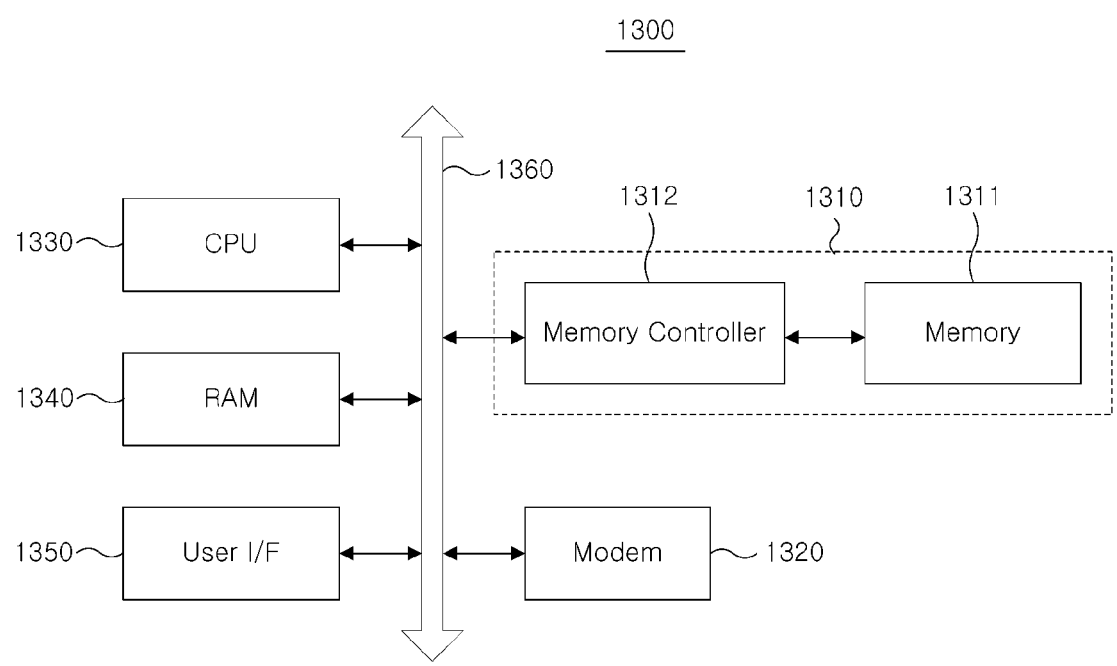
FIG. 13B is a block diagram of an information processing system including a semiconductor device according to an example embodiment of the inventive concepts.

FIG. 13A is a block diagram of a memory card including a semiconductor device according to an example embodiment of the inventive concepts. FIG. 13B is a block diagram of an information processing system including a semiconductor device according to an example embodiment of the inventive concepts.

Referring to FIG. 13A, a memory card 1200 may include a memory controller 1220 controlling general data exchanges between a host 1230 and a memory device 1210. A static random access memory (SRAM) 1221 may be used as an operating memory of a processing unit 1222 in the controller 1220. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. A processor 1222 may perform general control operations for data exchange of the memory controller 1220. The memory device 1210 may include at least one of the semiconductor device 1 and the semiconductor packages 90 according to an example embodiment of the inventive concepts.

FIG. 13B illustrates another implementation of the semiconductor device according to any of the above-described embodiments. Referring to FIG. 13B, an information processing system 1300 may be realized using a memory system 1310 including at least one of the semiconductor device 1 and the semiconductor packages 90 according to an example embodiment of the inventive concepts. For instance, the information processing system 1300 may be a mobile device and/or a computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured identical to the memory card 1200 described with respect to FIG. 13A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the inventive concepts.

According to example embodiments of the inventive concepts, a flowable CVD layer may be formed on a bottom surface of a substrate. This enables to improve a step coverage property and to increase uniformity in a protruding length of a through electrode. Furthermore, since the through electrode can be stably supported, it is possible to reduce or prevent the through electrode from being warped or broken during a planarization process, and as a result, it is possible to improve a production yield. In addition, the planarization process may be performed without a polishing process (e.g., CMP), which may result in the occurrence pollution or unwanted particles.

While example embodiments of the inventive concepts have been particularly shown and described, it will be understood by one of ordinary skill in the art that variations in form and detail may be made therein without departing from the spirit and scope of the attached claims.

We claim:

1. A method for fabricating a semiconductor device, comprising:
    forming a conductive via structure in a base layer, the base layer having a first surface and a second surface, the second surface being opposite the first surface;
    removing the second surface of the base layer to expose the conductive via structure such that the conductive via structure protrudes from the second surface; and
    performing flowable chemical vapor deposition to form a first lower insulating layer over the second surface, the performing flowable chemical vapor deposition forms the first lower insulating layer planar without polishing and leaves an end surface of the conductive via structure uncovered.

2. The method of claim 1, wherein
    the performing flowable chemical vapor deposition deposits a flowable layer, and
    the flowable layer includes one of Si—O, Si—H and Si—OH bonds.

3. The method of claim 1, wherein the performing flowable chemical vapor deposition covers sidewalls of a portion of the conductive via structure protruding from the second surface with the first lower insulating layer.

4. The method of claim 1, wherein the performing flowable chemical vapor deposition forms the first lower insulating layer such that a portion of side walls of the conductive via structure protruding from the second surface remains uncovered by the first lower insulating layer.

5. The method of claim 1, further comprising:
    performing a planarizing operation such that an exposed end surface of the conductive via structure and a surface of the first lower insulating layer are co-planar.

6. The method of claim 1, wherein the performing flowable chemical vapor deposition forms the first lower insulating layer such that a portion of the first insulating layer is disposed on side walls of a portion of the conductive via structure protruding from the second surface.

7. The method of claim 6, wherein the portion of the first insulating layer disposed on the side walls of the conductive via structure has a horizontal width that decreases towards a distal end of the conductive via structure.

8. The method of claim 6, further comprising:
performing a planarizing operation such that an exposed end surface of the conductive via structure and only a portion of a surface of the first lower insulating layer are co-planar.

9. The method of claim 6, further comprising:
forming a second lower insulating layer over the first lower insulating layer;
performing a planarizing operation such that an exposed surface of the conductive via structure, a surface of the second lower insulating layer and a surface of the first lower insulating layer are co-planar.

10. The method of claim 9, further comprising:
forming a terminal on the conductive via structure, a portion of the first lower insulating layer and a portion of the second lower insulating layer.

11. The method of claim 1, further comprising:
forming a second lower insulating layer over the second surface by chemical vapor deposition, the second lower insulating layer having a folded portion at sidewalls of the conductive via structure protruding from the second surface;
wherein the performing flowable chemical vapor deposition forms the first lower insulating layer on the second layer insulating layer such that the first lower insulating layer fills the folded portion.

12. The method of claim 11, further comprising:
performing a planarizing operation such that an exposed surface of the conductive via structure, a surface of the second lower insulating layer and a surface of the first lower insulating layer are co-planar.

13. The method of claim 12, further comprising:
forming a terminal on the conductive via structure, a portion of the second lower insulating layer and a portion of the first lower insulating layer.

14. The method of claim 1, wherein the forming a conductive via structure includes forming a via hole in the base layer and a first interlayered insulating layer,
the first interlayered insulating layer disposed on the first surface of the base layer and covering an integrated circuit.

15. The method of claim 14, further comprising:
forming a connection structure on the first interlayered insulating layer electrically connected to the conductive via structure and the integrated circuit; and
forming a second interlayered insulating layer on the first interlayered insulating layer to encapsulate the connection structure such that a bonding pad of the connection structure is exposed.

16. The method of claim 1, further comprising:
forming a first interlayered insulating layer on the first surface of the base layer and covering an integrated circuit;
forming a connection structure on the first interlayered insulating layer electrically connected the integrated circuit;
forming a second interlayered insulating layer on the first interlayered insulating layer to encapsulate the connection structure such that a bonding pad of the connection structure is exposed; and
forming a solder ball on the bonding pad,
wherein the forming a conductive via structure includes forming a via hole in the base layer and the first interlayered insulating layer such that the conductive via structure electrically connects to the connection structure.

17. The method of claim 1, further comprising:
forming an interlayered insulating layer over the first surface of the base layer to encapsulate an integrated circuit and a connection structure such that a bonding pad of the connection structure is exposed,
the connection structure electrically connected to the integrated circuit and the conductive via structure.

18. The method of claim 1, wherein the performing flowable chemical vapor deposition comprises,
providing a silicon-containing compound and an oxidizing agent on the second surface, the oxidizing agent being a liquid;
condensing the silicon-containing compound and the oxidizing agent to deposit a flowable layer; and
converting the flowable layer into the first lower insulating layer.

19. The method of claim 18, wherein the liquid is an alcohol.

* * * * *